(12) United States Patent
Shin et al.

(10) Patent No.: US 11,683,967 B2
(45) Date of Patent: Jun. 20, 2023

(54) TILED DISPLAY DEVICE

(71) Applicant: Samsung Display Co., Ltd., Yongin-si (KR)

(72) Inventors: Dong Hee Shin, Asan-si (KR); Sunkwun Son, Suwon-si (KR); Nahyeon Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 94 days.

(21) Appl. No.: 17/223,658

(22) Filed: Apr. 6, 2021

(65) Prior Publication Data
US 2022/0077277 A1 Mar. 10, 2022

(30) Foreign Application Priority Data
Sep. 4, 2020 (KR) .................. 10-2020-0113128

(51) Int. Cl.
*H10K 59/121* (2023.01)
*H01L 27/32* (2006.01)
(Continued)

(52) U.S. Cl.
CPC .......... *H01L 27/3293* (2013.01); *G02F 1/133* (2013.01); *G02F 1/13306* (2013.01); *G09G 3/3225* (2013.01); *H01L 25/167* (2013.01); *H01L 27/124* (2013.01); *H01L 27/1255* (2013.01); *H01L 27/3218* (2013.01); *H01L 27/3262* (2013.01); *H01L 27/3265* (2013.01); *H01L 27/3276* (2013.01)

(58) Field of Classification Search
CPC ............. H01L 27/3293; H01L 27/3218; H01L 27/326; H01L 25/167; H01L 27/124; H01L 27/1255; H01L 27/3262; H01L 27/3265; H01L 27/3276; H01L 27/322; H01L 2251/5369; H01L 25/0753; H01L 33/62; H01L 27/3246; G02F 1/133; G02F 1/13306; G09G 3/3225; G09G 3/3208; G09F 9/30
See application file for complete search history.

(56) References Cited

U.S. PATENT DOCUMENTS

| | | | |
|---|---|---|---|
| 2005/0099411 A1* | 5/2005 | Van Brocklin | G02F 1/13336 345/204 |
| 2007/0126671 A1* | 6/2007 | Naoaki | G09G 3/3225 345/77 |
| 2017/0301737 A1* | 10/2017 | Gu | G09G 3/3208 |

FOREIGN PATENT DOCUMENTS

| KR | 10-1015275 B1 | 2/2011 |
|---|---|---|
| KR | 10-1157425 B1 | 6/2012 |

(Continued)

*Primary Examiner* — Donald L Raleigh
(74) *Attorney, Agent, or Firm* — Lewis Roca Rothgerber Christie LLP

(57) ABSTRACT

Provided is a tiled display device including a first sub-display panel on which a plurality of unit pixels is formed, and a second sub-display panel on which a plurality of unit pixels is formed, and located adjacent to the first sub-display panel, wherein each of the unit pixels includes a display element for emitting colored light, and a plurality of sub-pixels having a pixel circuit for driving the display element, and wherein an arrangement order of sub-pixels in the unit pixels corresponding to a current row, and an arrangement order of the sub-pixels in the unit pixels corresponding to a previous row or a next row, are different from each other.

18 Claims, 30 Drawing Sheets

(51) Int. Cl.
    *H01L 25/16*     (2023.01)
    *H01L 27/12*     (2006.01)
    *G02F 1/133*     (2006.01)
    *G09G 3/3225*     (2016.01)

(56) References Cited

FOREIGN PATENT DOCUMENTS

| | | | |
|---|---|---|---|
| KR | 10-2019-0014216 A | 2/2019 | |
| KR | 10-2019-0072196 A | 6/2019 | |

\* cited by examiner

TILED DISPLAY DEVICE

CROSS-REFERENCE TO RELATED APPLICATION

This application claims priority to and the benefit of Korean Patent Application No. 10-2020-0113128, filed on Sep. 4, 2020 in the Korean Intellectual Property Office (KIPO), the contents of which are herein incorporated by reference in their entirety.

BACKGROUND

1. Field

Embodiments of the present disclosure relate to a tiled display device in which spots are improved at a junction portion, and a sub-display panel employed therein.

2. Description of the Related Art

In general, a plurality of display panels may be connected and arranged to realize an extra-large TV. This is called a tiled display device. Here, the display panels may be connected in a matrix form or in a stripe form.

Typically, when the display panels are connected, the display panel located at the lower portion is attached to the display panel and is inverted by about 180 degrees with respect to the display panel located at the upper portion. When the stripe pixels are formed on the display panel, a pixel position at the junction portion is reversed. For example, pixels are arranged in the order of a red sub-pixel, a green sub-pixel, and a blue sub-pixel on an upper display panel, while pixels are arranged in the order of a blue sub-pixel, a green sub-pixel, and a red sub-pixel on a lower display panel. Accordingly, there may be a problem in that spots are visually recognized in the junction portion due to pixel asymmetry.

Accordingly, even if the lower display panel is attached by inverting it by about 180 degrees, it may be suitable to change the pixel arrangement so that asymmetry does not occur at the junction portion.

In other words, when sub-pixels are arranged in the order of red, green, and blue in the (2n)-th row and the sub-pixels are arranged in the order of blue, green, and red in the (2n+1)-th row, monochromatic and mixed color irregularities are visually recognized. That is, because the red sub-pixels and the blue sub-pixels are alternately arranged, but the green sub-pixels are arranged in a center portion, the spot is visually recognized by the green sub-pixels arranged in a vertical direction.

SUMMARY

Embodiments of the present disclosure provide a tiled display device in which spots are suppressed at a junction portion to which a plurality of display panels is attached.

Embodiments of the present disclosure also provide a sub-display panel employed in the above-mentioned tiled display device.

According to one aspect of the present disclosure, a tiled display device includes a first sub-display panel on which a plurality of unit pixels is formed, and a second sub-display panel on which a plurality of unit pixels is formed, and located adjacent to the first sub-display panel, wherein each of the unit pixels includes a display element for emitting colored light, and a plurality of sub-pixels having a pixel circuit for driving the display element, and wherein an arrangement order of sub-pixels in the unit pixels corresponding to a current row, and an arrangement order of the sub-pixels in the unit pixels corresponding to a previous row or a next row, are different from each other.

The display elements arranged in a column direction may be configured to emit light of different colors.

One of the sub-pixels corresponding to an (n)-th row and an (m)-th column, 'n' and cm' being natural numbers, may be configured to emit a first color light, and wherein another one of the sub-pixels corresponding to an (n+1)-th row and the (m)-th column is configured to emit a second color light.

An arrangement order of sub-pixels in a unit pixel corresponding to a 2(n)-th row, 'n' being a natural number, may be C3-C1-C2, C1 being a first sub-pixel for emitting a first color light, C2 being a second sub-pixel for emitting a second color light, and C3 being a third sub-pixel for emitting a third color light, wherein an arrangement order of sub-pixels in a unit pixel corresponding to a (2n−1)-th row are C1-C2-C3.

The first sub-pixel may be configured to emit red color light, the second sub-pixel is configured to emit green color light, and the third sub-pixel is configured to emit green color light.

An arrangement order of sub-pixels in a unit pixel corresponding to a 3(n)-th row, 'n' being a natural number, may be C2-C3-C1, C1 being a first sub-pixel for emitting a first color light, C2 being a second sub-pixel for emitting a second color light, and C3 being a third sub-pixel for emitting a third color light, wherein an arrangement order of sub-pixels in a unit pixel corresponding to a (3n−1)-th row is C3-C1-C2, and wherein an arrangement order of sub-pixels in the unit pixel corresponding to a (3n−2)-th row is C1-C2-C3.

The first sub-pixel may be configured to emit red color light, the second sub-pixel is configured to emit green color light, and the third sub-pixel is configured to emit green color light.

An arrangement order of sub-pixels in a unit pixel corresponding to a 4(n)-th row, 'n' being a natural number, may be C3-C1-C2, C1 being a first sub-pixel for emitting a first color light, C2 being a second sub-pixel for emitting a second color light, and C3 being a third sub-pixel for emitting a third color light, wherein an arrangement order of sub-pixels in a unit pixel corresponding to a (4n−1)-th row is C2-C3-C1, wherein an arrangement order of sub-pixels in a unit pixel corresponding to a (4n−2)-th row is C3-C1-C2, and wherein an arrangement order of sub-pixels in a unit pixel corresponding to a (4n−3)-th row is C1-C2-C3.

The first sub-pixel may be configured to emit red color light, the second sub-pixel is configured to emit green color light, and the third sub-pixel is configured to emit green color light.

Each of the unit pixels may include a first sub-pixel, a second sub-pixel, and a third sub-pixel, wherein the first sub-pixel is a red sub-pixel for emitting a red color light, the second sub-pixel is a green sub-pixel for emitting a green color light, and the third sub-pixel is a blue sub-pixel for emitting a blue color light.

The tiled display device may further include a third sub-display panel and a fourth sub-display panel.

One of the sub-pixels may include a current scan wiring, a first data wiring for transmitting a data signal corresponding to a first color light, a second data wiring for transmitting a data signal corresponding to a second color light, and a third data wiring for transmitting a data signal corresponding to a third color light, wherein the pixel circuit includes a first transistor connected to the display element, and a second transistor connected to the current scan wiring, and wherein a source electrode of the second transistor is connected to one of the first data wiring, the second data wiring, and the third data wiring.

The display element may be an organic light-emitting diode or a nanodiode.

According to another aspect of the present disclosure, a sub-display panel for a tiled display device in which a plurality of sub-display panels is attached to form a tiled display device includes a first unit pixel including a plurality of sub-pixels arranged on a plane, and a second unit pixel located adjacent to the first unit pixel in a column direction, and including a plurality of sub-pixels arranged on a plane, wherein each of the first and second unit pixels includes a plurality of sub-pixels having a display element for emitting colored light, and a pixel circuit for driving the display element, and wherein an arrangement order of sub-pixels in unit pixels corresponding to a current row and an arrangement order of sub-pixels in unit pixels corresponding to a previous row or a next row are different from each other.

Each of the first unit pixel and the second unit pixel may include a first sub-pixel for emitting a first color light, a second sub-pixel for emitting a second color light, and a third sub-pixel for emitting a third color light, wherein an arrangement order of the first to third sub-pixels provided in the first unit pixel and an arrangement order of the first to third sub-pixels provided in the second unit pixel are different from each other.

An arrangement order of sub-pixels in the first unit pixel may be C3-C1-C2, C1 being a first sub-pixel for emitting a first color light, C2 being a second sub-pixel for emitting a second color light, and C3 being a third sub-pixel for emitting a third color light, wherein an arrangement order of sub-pixels in the second unit pixel is C1-C2-C3.

The sub-display panel for a tiled display device may further include a third unit pixel located adjacent to the second unit pixel in a column direction, and including a plurality of sub-pixels arranged in a third order in a row direction on a plane, wherein an arrangement order of the sub-pixels in the first unit pixel is C2-C3-C1, C1 being a first sub-pixel for emitting a first color light, C2 being a second sub-pixel for emitting a second color light, and C3 being a third sub-pixel for emitting a third color light, wherein an arrangement order of sub-pixels in the second unit pixel is C3-C1-C2, and wherein an arrangement order of sub-pixels in the third unit pixel is C1-C2-C3.

The sub-display panel for a tiled display device may further include a third unit pixel located adjacent to the second unit pixel in a column direction to include a plurality of sub-pixels arranged in a third order in a row direction on a plane, and a fourth unit pixel located adjacent to the third unit pixel in a column direction to include a plurality of sub-pixels arranged in a fourth order in a row direction on a plane, wherein an arrangement order of the sub-pixels in the first unit pixel is C3-C1-C2, C1 being a first sub-pixel for emitting a first color light, C2 being a second sub-pixel for emitting a second color light, and C3 being a third sub-pixel for emitting a third color light, wherein an arrangement order of sub-pixels in the second unit pixel is C2-C3-C1, wherein an arrangement order of sub-pixels in the third unit pixel is C3-C1-C2, and wherein an arrangement order of sub-pixels in the fourth unit pixel is C1-C2-C3.

According to a tiled display device and a sub-display panel employed therein, an arrangement order of sub-pixels in the unit pixels corresponding to the current row and an arrangement order of sub-pixels in the unit pixels corresponding to the previous row or the next row may be different from each other, so that it is possible to improve the visibility of spots due to the sub-pixel arrangement near a junction portion to which a plurality of display panels are attached.

BRIEF DESCRIPTION OF THE DRAWINGS

The above and other aspects of the present disclosure will become more apparent by describing in detailed embodiments thereof with reference to the accompanying drawings, in which.

DETAILED DESCRIPTION

Figure 1:
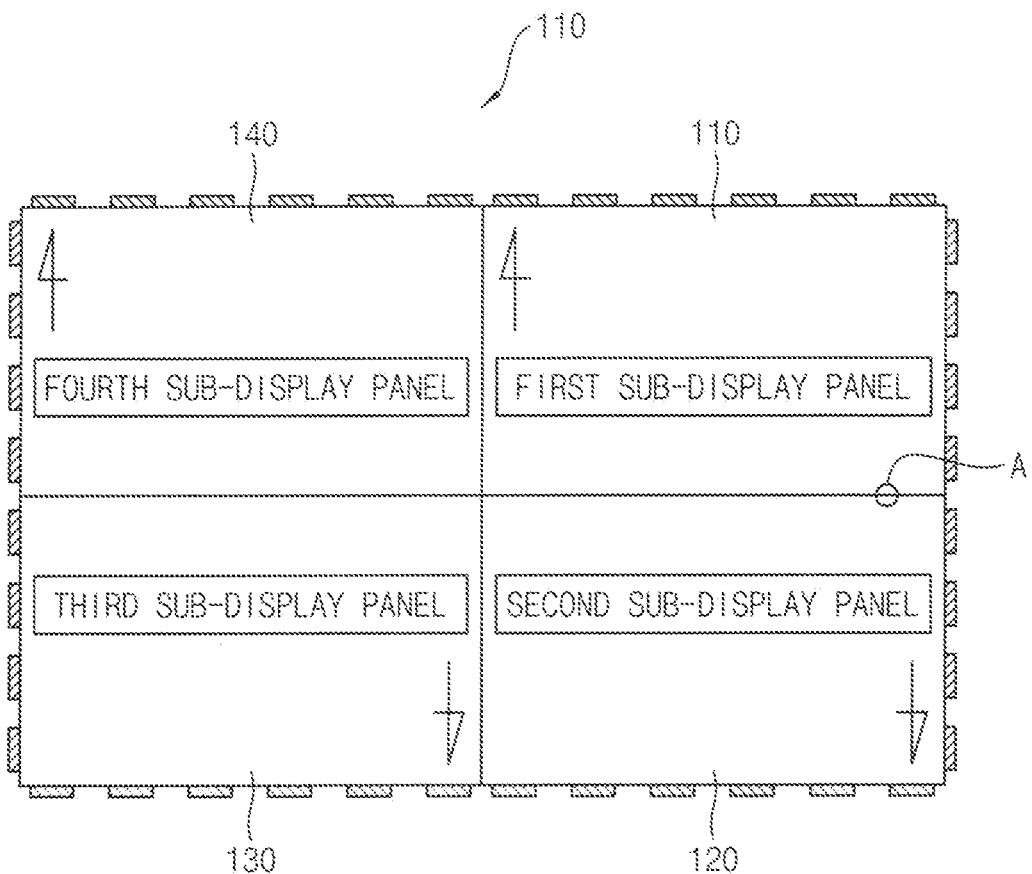
FIG. 1 is a plan view schematically illustrating a tiled display device according to some embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view schematically illustrating a tiled display device according to some embodiments of the present disclosure.

Referring to FIG. 1, a tiled display device according to some embodiments of the present disclosure includes a first sub-display panel 110, a second sub-display panel 120, a third sub-display panel 130, and a fourth sub-display panel 140, which define an image display unit by forming a plurality of pixels.

The first sub-display panel 110 is located on the first quadrant from the viewpoint of the observer, and the second sub-display panel 120 is located on the second quadrant from the viewpoint of the observer. The third sub-display panel 130 is located on the third quadrant from the viewpoint of the observer, and the fourth sub-display panel 140 is located on the fourth quadrant from the viewpoint of the observer.

The second sub-display panel 120 is attached to be inverted 180 degrees as compared to the first sub-display panel 110. The fourth sub-display panel 140 is attached to be inverted about 180 degrees as compared to the third sub-display panel 130.

Each of the first to fourth sub-display panels 110, 120, 130, and 140 includes a plurality of unit pixels corresponding to a plurality of wirings. Each of the unit pixels may include a plurality of sub-pixels. The sub-pixels may include a first sub-pixel emitting a first color light, a second sub-pixel emitting a second color light, and a third sub-pixel emitting a third color light. For example, the sub-pixels may include a red sub-pixel emitting a red light, a green sub-pixel emitting a green light, and a blue sub-pixel emitting a blue light.

In each of the sub-display panels 110, 120, 130, and 140, an arrangement order of sub-pixels in unit pixels corresponding to a current row and an arrangement order of sub-pixels in unit pixels corresponding to a previous row or a next row is different from each other.

In other words, when observing sub-pixels in a unit pixel, a sub-pixel of the (n)-th row (here, 'n' is a natural number) and a sub-pixel of the (n+1)-th row may be arranged to emit different color light.

Accordingly, a sub-pixel corresponding to the (n)-th row and (m)-th column (here, 'n' and cm' are natural numbers) emits a first color light, and a sub-pixel corresponding to the (n+1)-th row and the (m)-th column emits a second color light.

Figure 2:
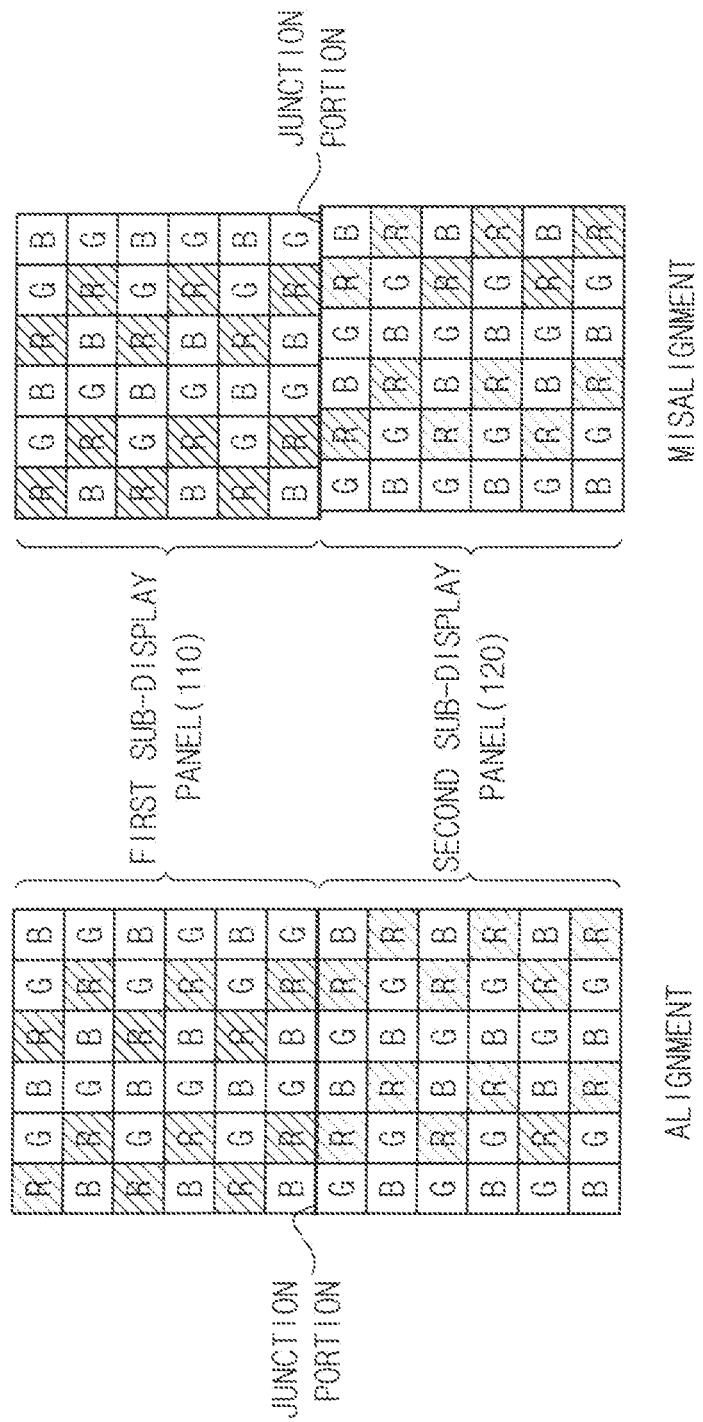
FIG. 2 is a plan view illustrating an example of a color arrangement corresponding to a junction portion of the tiled display device illustrated in FIG. 1.
Figure 3:
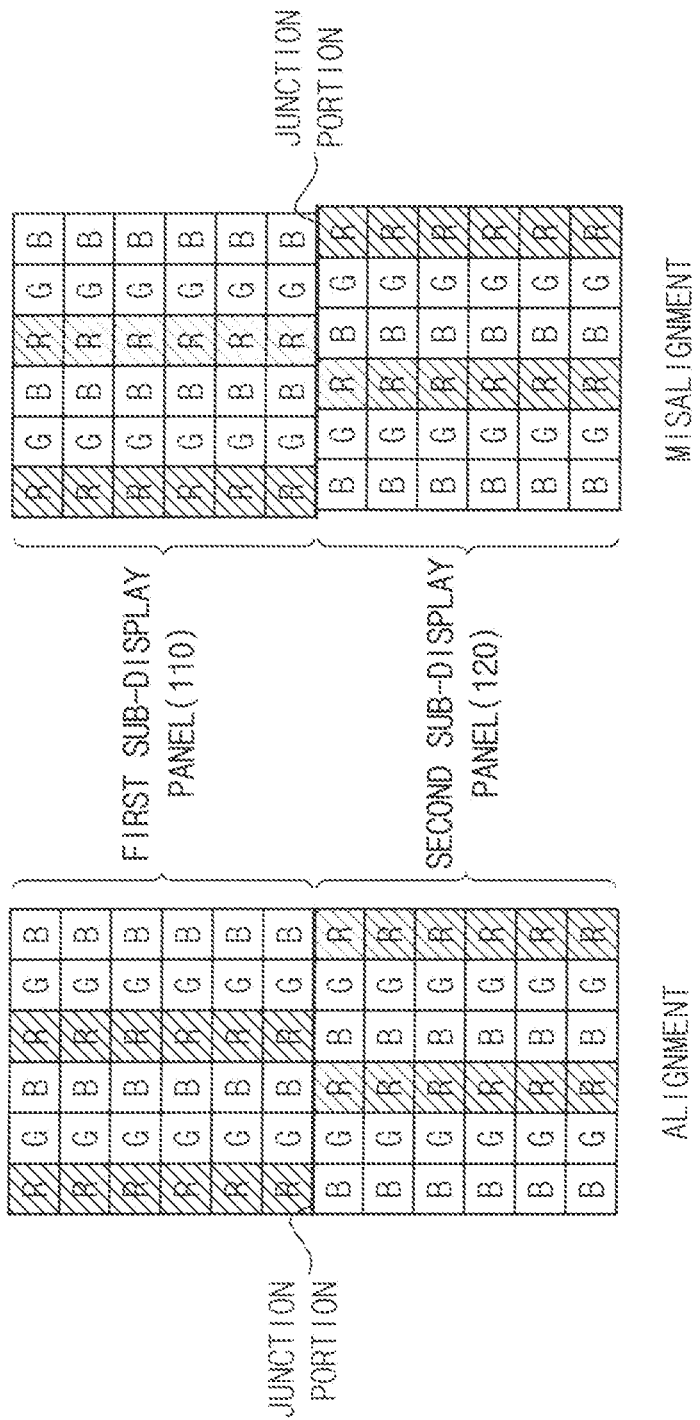
FIG. 3 is a plan view illustrating an example of a color arrangement according to a comparative example.

FIG. 2 is a plan view illustrating an example of a color arrangement corresponding to a junction portion of the tiled display device illustrated in FIG. 1, and FIG. 3 is a plan view illustrating an example of a color arrangement according to a comparative example. For example, FIG. 2 and FIG. 3 illustrate an excerpted junction portion of the tiled display device. Here, the junction portion is defined as an area between adjacent sub-display panels.

Referring to FIG. 2, in each of a unit pixel corresponding to odd-numbered rows, a first sub-pixel emitting a first color light, a second sub-pixel emitting a second color light, and a third sub-pixel emitting a third color light are arranged. For example, in each of the unit pixels corresponding to odd-numbered rows, sub-pixels are arranged in an arrangement order of a red sub-pixel (R) emitting red light, a green sub-pixel (G) emitting green light, and a blue sub-pixel (B) emitting blue light. In addition, in each of the unit pixels corresponding to even-numbered row, sub-pixels are arranged in an arrangement order of the blue sub-pixel (B), the red sub-pixel (R) and the green sub-pixel (G).

In this way, sub-pixels are staggered with each other in unit pixels corresponding to wirings adjacent to each other. In other words, sub-pixels are arranged in an arrangement order of R-G-B in a unit pixel corresponding to the first row, and sub-pixels are arranged in an arrangement order of B-R-G in a unit pixel corresponding to the second row.

Accordingly, even if the second sub-display panel 120 is attached to the first sub-display panel 110 by inverting the first sub-display panel 110 by about 180 degrees, it is possible to prevent spot visibility caused by pixel asymmetry at a junction portion.

In addition, even if the first sub-display panel 110 and the second sub-display panel 120 are misaligned, it is possible to reduce or prevent the visibility of spots caused by pixel asymmetry at the junction portion.

On the other hand, referring to FIG. 3, in each of the unit pixels corresponding to all rows, sub-pixels are arranged in an arrangement order of red sub-pixels (R), green sub-pixels (G), and blue sub-pixels (B).

Accordingly, when the second sub-display panel 120 is attached to the first sub-display panel 110 by inverting 180 degrees with respect to the first sub-display panel 110, spots caused by pixel asymmetry at a junction portion may be recognized.

In addition, when the first sub-display panel 110 and the second sub-display panel 120 are misaligned, spots due to pixel asymmetry at a junction portion may be recognized more remarkably.

Figure 4:
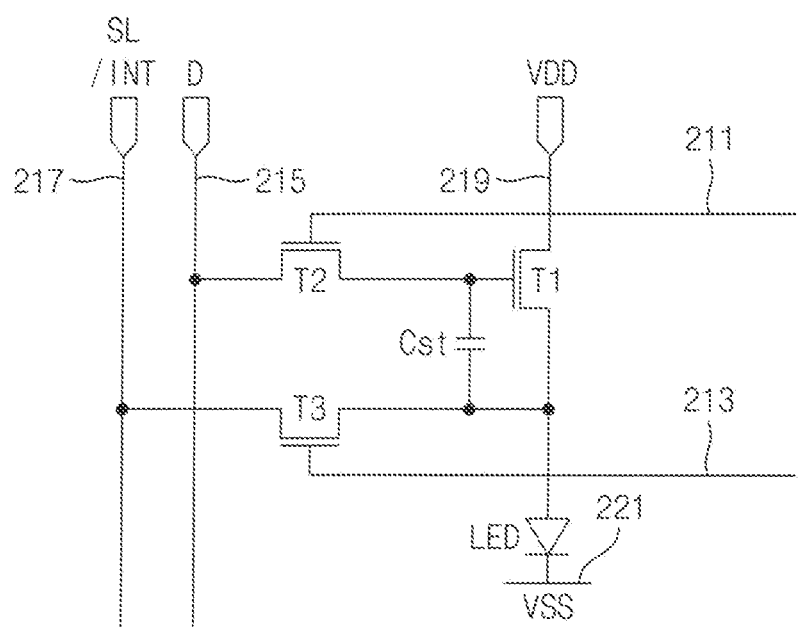
FIG. 4 is an equivalent circuit diagram for describing the sub-pixel shown in FIG. 2.

FIG. 4 is an equivalent circuit diagram for describing the sub-pixel shown in FIG. 2.

Referring to FIG. 4, a sub-pixel PX provided in a unit pixel includes a plurality of transistors T1, T2, and T3, a capacitor Cst, and diodes LED connected to various signal wirings. In some embodiments, the diode LED may be an organic light-emitting diode (OLED) or a nano diode.

The display device according to the embodiments corresponding to FIG. 1 shows a display device used in high resolution (4K or 8K). The sub-pixel PX is controlled by signals of a current scan wiring 211 and a data wiring 215. In some embodiments, the data wiring 215 may be one of a red data wiring connected to a red sub-pixel emitting a red light, a green data wiring connected to a green sub-pixel emitting a green light, and a blue data wiring connected to a blue sub-pixel emitting a blue light.

A plurality of transistors T1, T2, and T3 included in one sub-pixel PX includes a driving transistor T1 (or a first transistor T1), a switching transistor T2 (or a second transistor T2) connected to the current scan wiring 211, and an initialization transistor T3 (or a third transistor T3, or a sensing transistor) connected to a previous scan wiring 213. The third transistor T3 may be connected to a signal wiring applying a gate-on voltage at a different timing from the previous scan wiring 213.

A plurality of signal wires included in one sub-pixel PX may include a current scan wiring 211, a previous scan wiring 213, a data wiring 215, an initialization voltage wiring 217 (or a sensing wiring), a driving high-voltage wiring 219, and a driving low-voltage wiring 221.

The current scan wiring 211 is connected to a gate driver to transmit a scan signal Sn to the second transistor T2.

The previous scan wiring 213 is connected to the gate driver. The previous scan wiring 213 transmits the scan signal Sn−1 applied to the sub-pixel PX positioned at the front end to the third transistor T3.

The data wiring 215 is a wiring for transmitting the data voltage Dm generated by the data driver. The luminance emitted by a diode changes according to the data voltage Dm provided to the sub-pixel PX along the data wiring 215.

The driving high-voltage wiring 219 applies a driving high-voltage VDD, and the driving low-voltage wiring 221 applies a driving low-voltage VSS. The driving high-voltage wiring 219 and the driving low-voltage wiring 221 according to some embodiments may include wiring extending in a horizontal direction and wiring extending in a vertical direction, and may be formed in a mesh structure. A constant voltage may be applied to each of the driving high-voltage wiring 219 and the driving low-voltage wiring 221. The driving high-voltage VDD serves as an input voltage for generating an output current in the driving transistor T1. When an output current is applied to one electrode of a diode (LED), a driving low-voltage (VSS) is applied to another electrode (hereinafter, referred to as a cathode).

Figure 5:
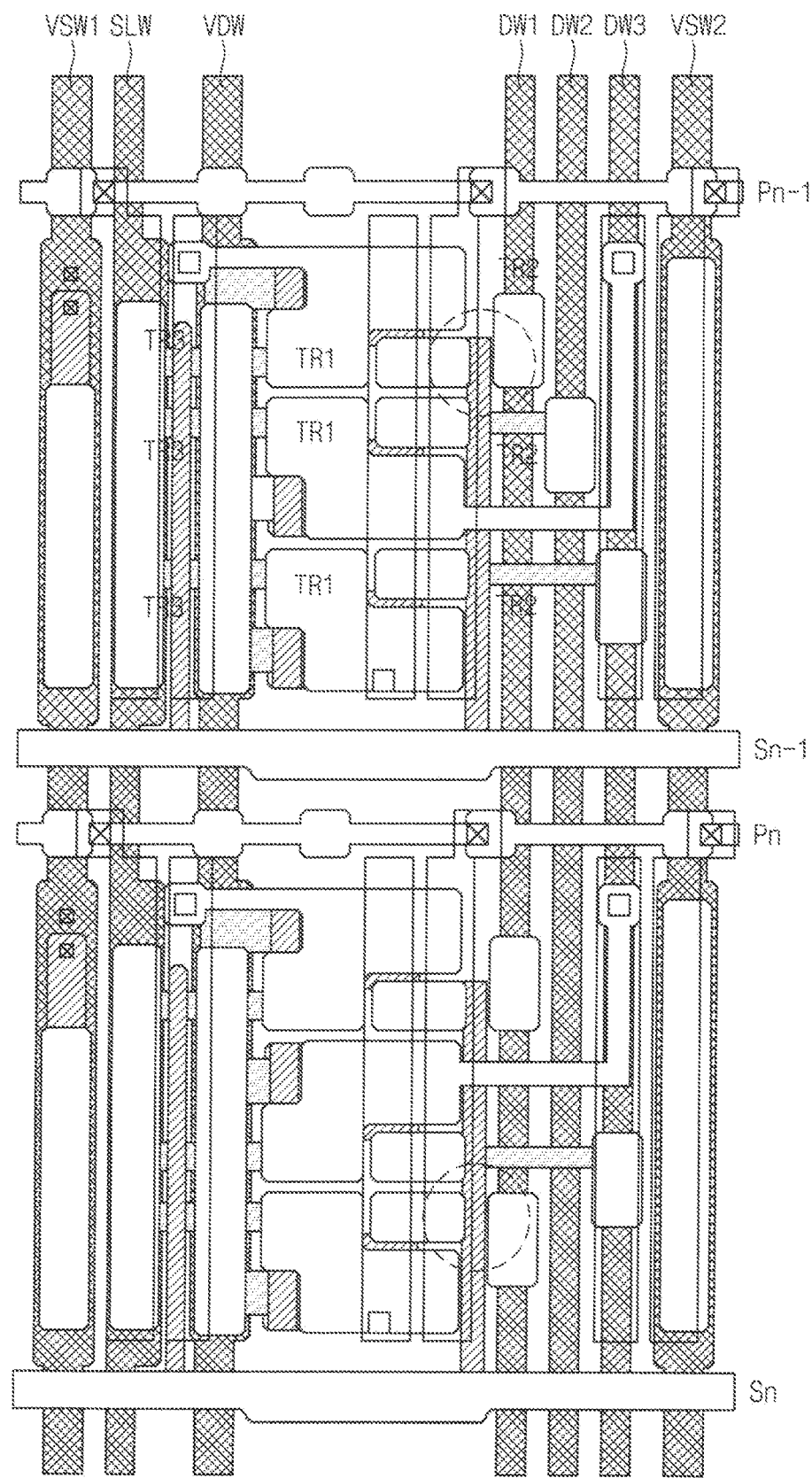
FIG. 5 is a plan view illustrating two unit pixels shown in FIG. 2.
Figure 6:
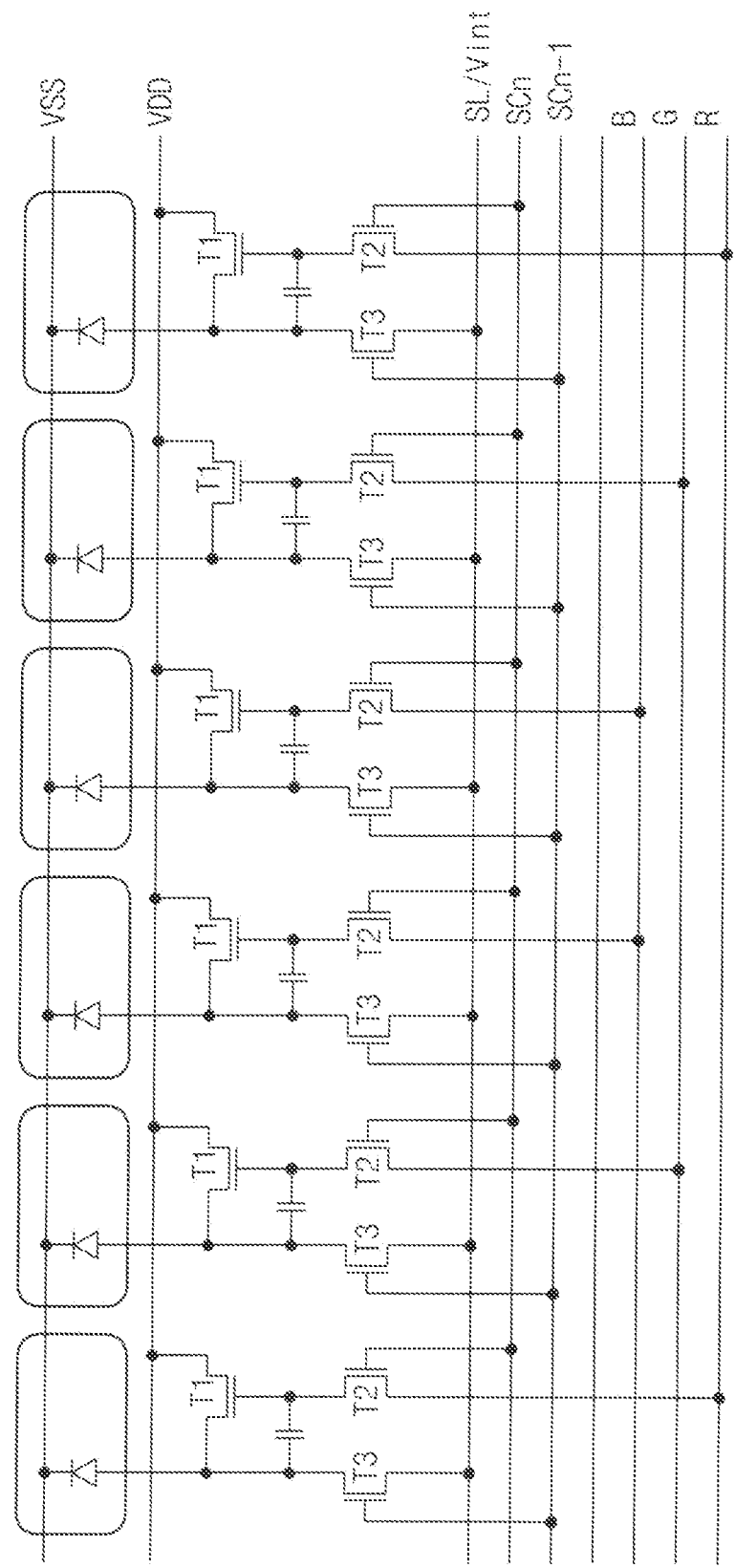
FIG. 6 is an equivalent circuit diagram explaining a connection relationship between two unit pixels shown in FIG. 5.

FIG. 5 is a plan view illustrating two unit pixels shown in FIG. 2, and FIG. 6 is an equivalent circuit diagram explaining a connection relationship between two unit pixels shown in FIG. 5. For example, two unit pixels adjacent to the same column are shown.

Referring to FIG. 5 and FIG. 6, the display device may include a substrate SUB, a wiring unit, and unit pixels. Each of the unit pixels may include a plurality of sub-pixels. Each of the sub-pixels may include a pixel circuit and a display device OLED. Here, the sub-pixels may include red sub-pixels emitting red lights, green sub-pixels emitting green lights, and blue sub-pixels emitting blue lights. The pixel circuit may include first to third transistors T1 to T3 and storage capacitors Cst. The display device OLED may be any one of an organic light-emitting diode and a nanodiode.

The substrate SUB may include a transparent insulating material so that light may be transmitted. The substrate SUB may be a rigid substrate. For example, the substrate SUB may be any one of a glass substrate, a quartz substrate, a glass ceramic substrate, and/or a crystalline glass substrate.

In addition, the substrate SUB may be a flexible substrate. Here, the substrate SUB may be any one of a film substrate and a plastic substrate including a polymer organic material. However, the material constituting the substrate SUB may be variously changed. For example, the substrate SUB may include fiber reinforced plastic (FRP) and the like.

The wiring unit provides a signal to each of the pixels. The wiring unit may include scan wirings Sn−1 and Sn, a first data wiring DW1, a second data wiring DW2, a third data wiring DW3, horizontal power wirings Pn−1 and Pn, power wirings PL (discussed further below with respect to FIGS. 7P and 7Q), and initialization power wirings.

The scan wirings Sn−1 and Sn may extend in a horizontal direction. The scan wirings Sn−1 and Sn may include an (n−1)-th scan wiring Sn−1 and an (n)-th scan wiring Sn that are sequentially arranged along a vertical direction. The scan wirings Sn−1 and Sn may receive a scan signal. For example, the (n−1)-th scan wiring Sn−1 may receive an (n−1)-th scan signal, and the (n)-th scan wiring Sn may receive an (n)-th scan signal. The (n−1)-th scan wiring Sn−1 may initialize the pixels of the (n)-th row by the (n−1)-th scan signal.

The horizontal power wirings Pn−1 and Pn may extend in a horizontal direction. The horizontal power wirings Pn−1 and Pn may be connected to a power wiring arranged in a vertical direction to form a mesh type power supply wiring.

The first to third data wirings DW1, DW2, and DW3 extend in a vertical direction and may be sequentially arranged in a horizontal direction. The first to third data wirings DW1, DW2, and DW3 may receive a data signal R, G, and B, respectively.

A driving high-voltage wiring VDW may extend along a vertical direction. The driving high-voltage wiring VDW may be located to be spaced apart from the first to third data wirings DW1, DW2, and DW3. The driving high-voltage wiring VDW may receive a driving high-voltage VDD.

A driving low-voltage wiring VSW1 may extend along a vertical direction. The driving low-voltage wiring VSW1 may be located to be spaced apart from the first to third data wirings DW1, DW2, and DW3. The driving low-voltage wiring VSW1 may receive a driving low-voltage VSS.

An initialization power wiring SLW may extend along a vertical direction. The initialization power wiring SLW may receive initialization power Vint.

Figure 7A:
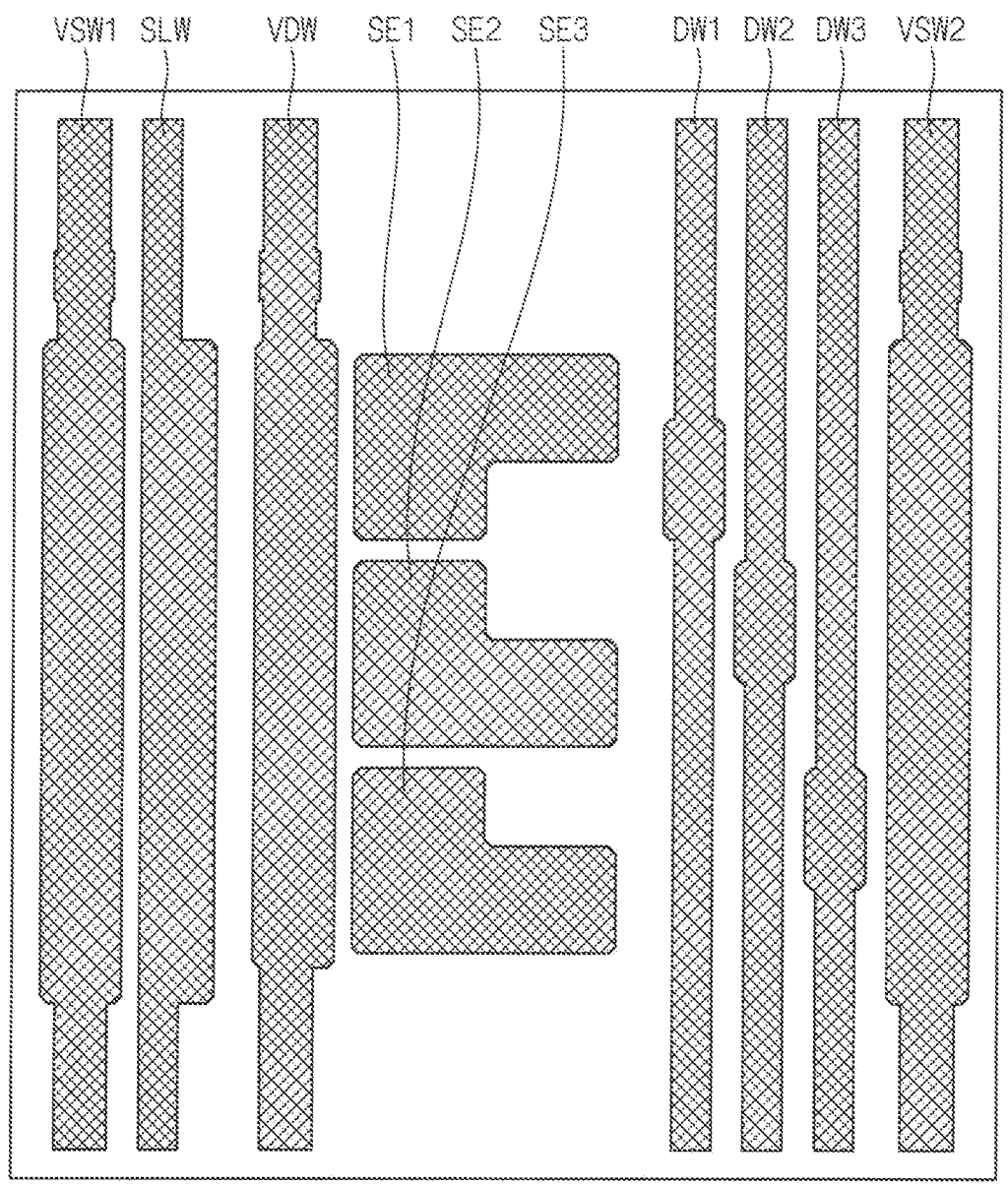
FIG. 7A to FIG. 7S are plan views illustrating a method of manufacturing the pixel shown in FIG. 4.
Figure 7B:
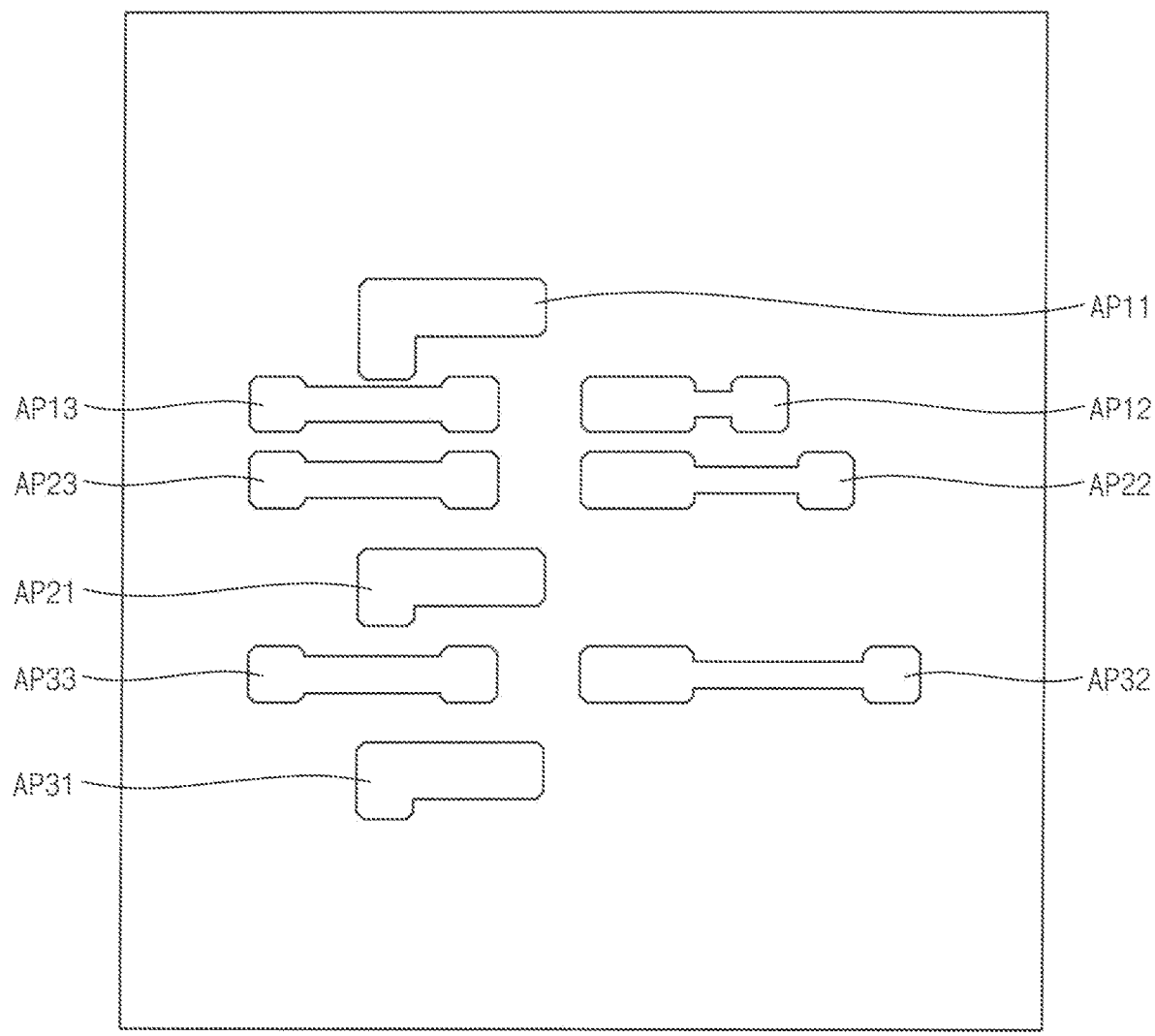
Figure 7C:
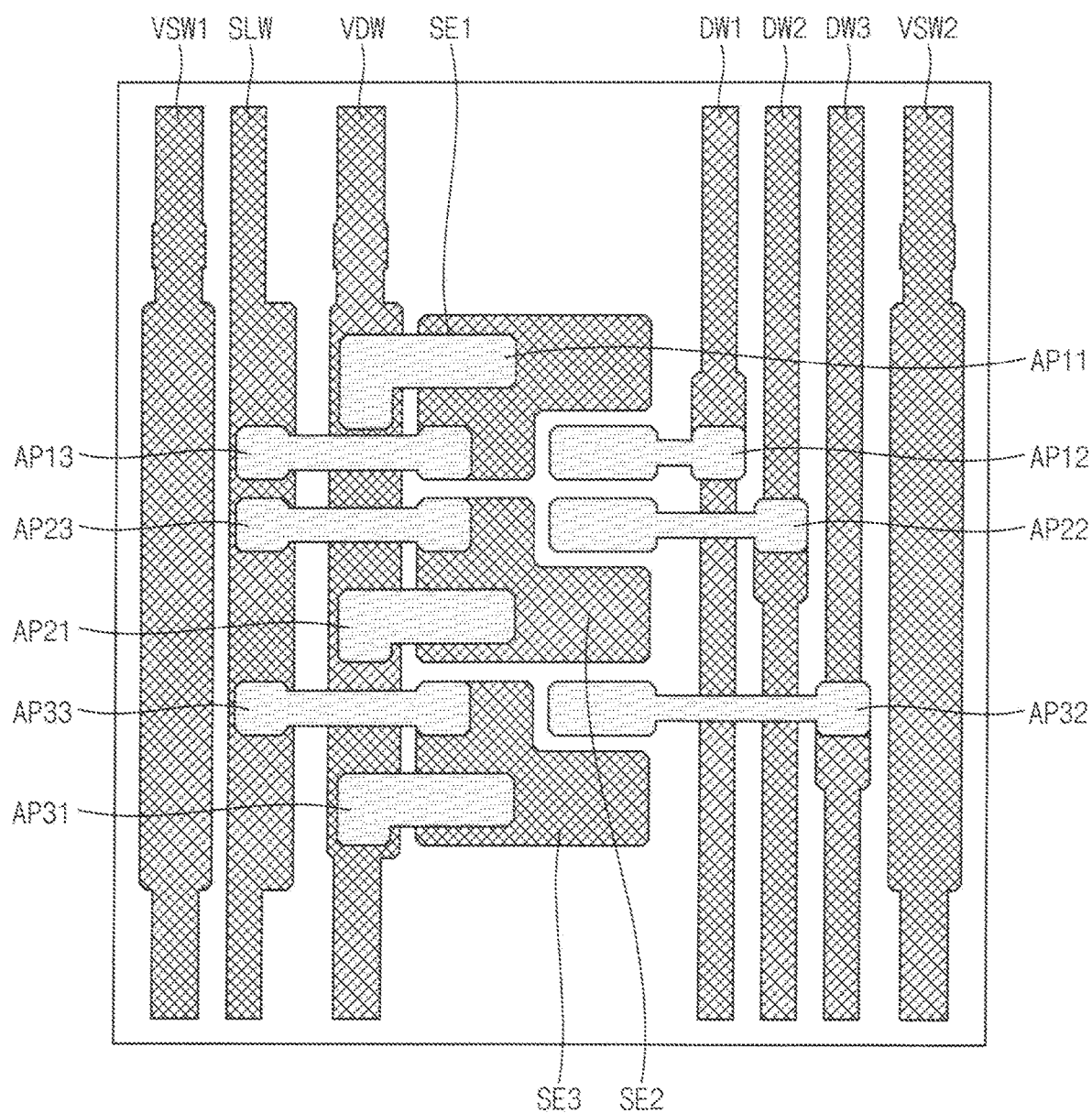
Figure 7D:
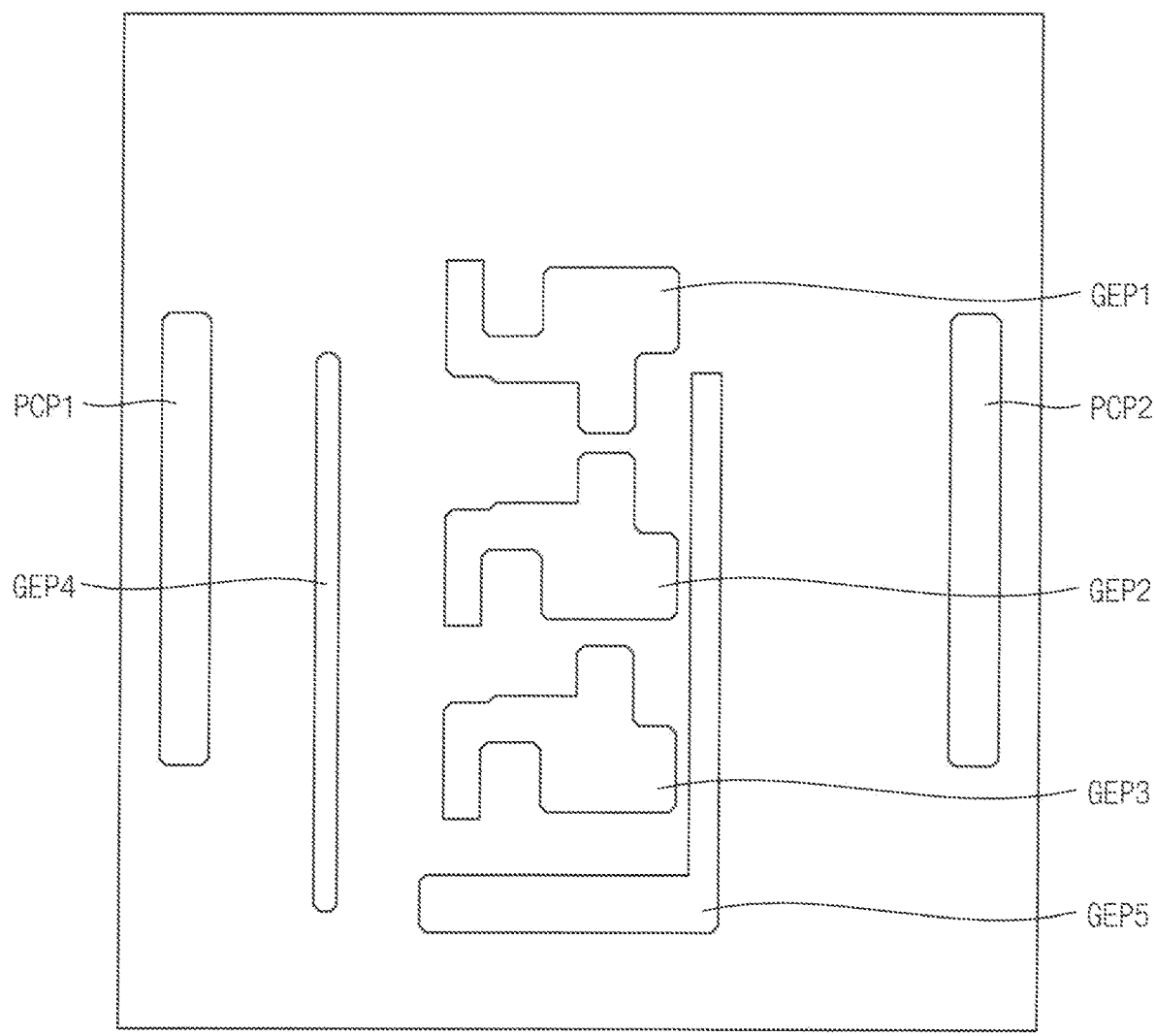
Figure 7E:
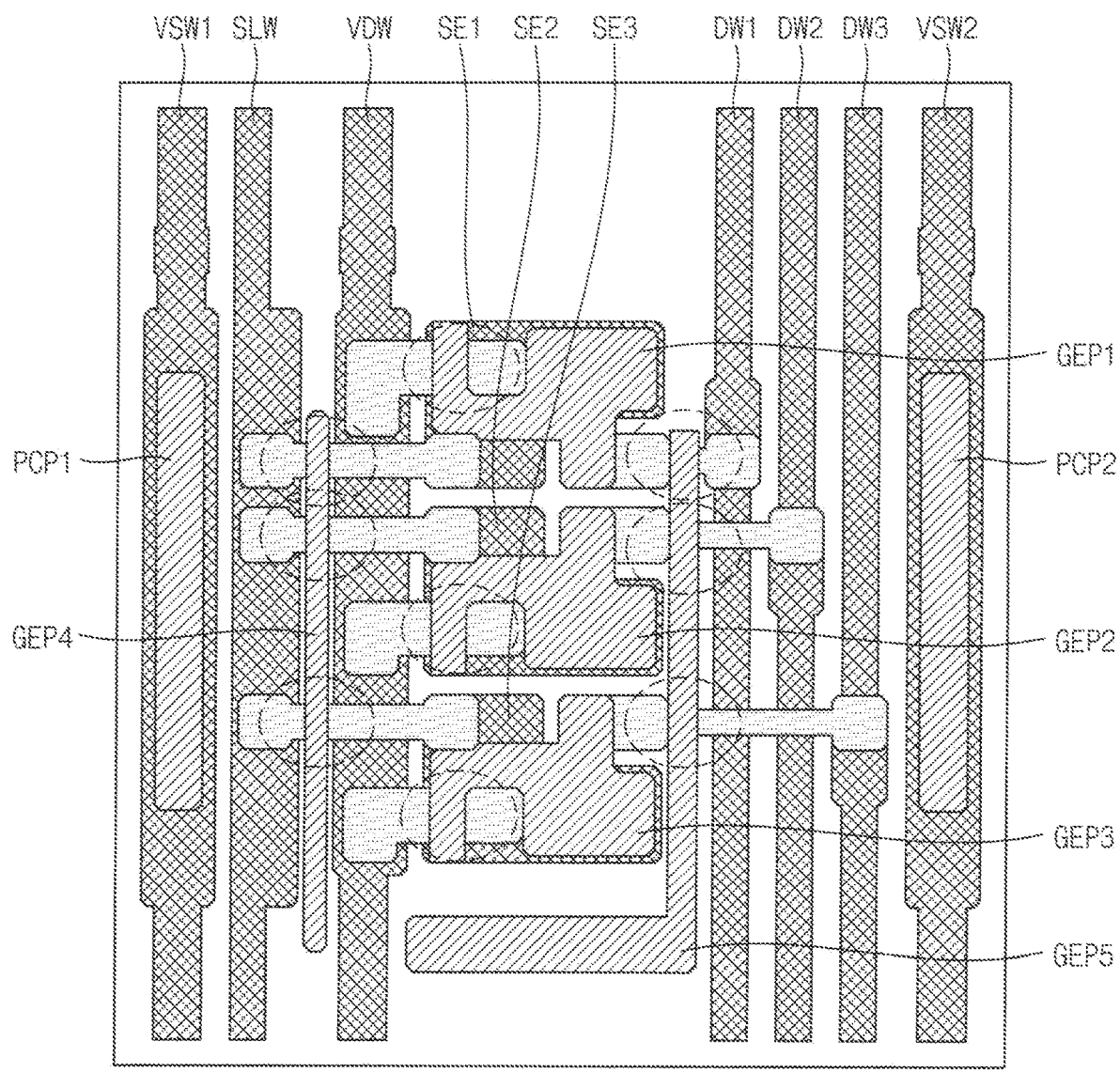
Figure 7F:
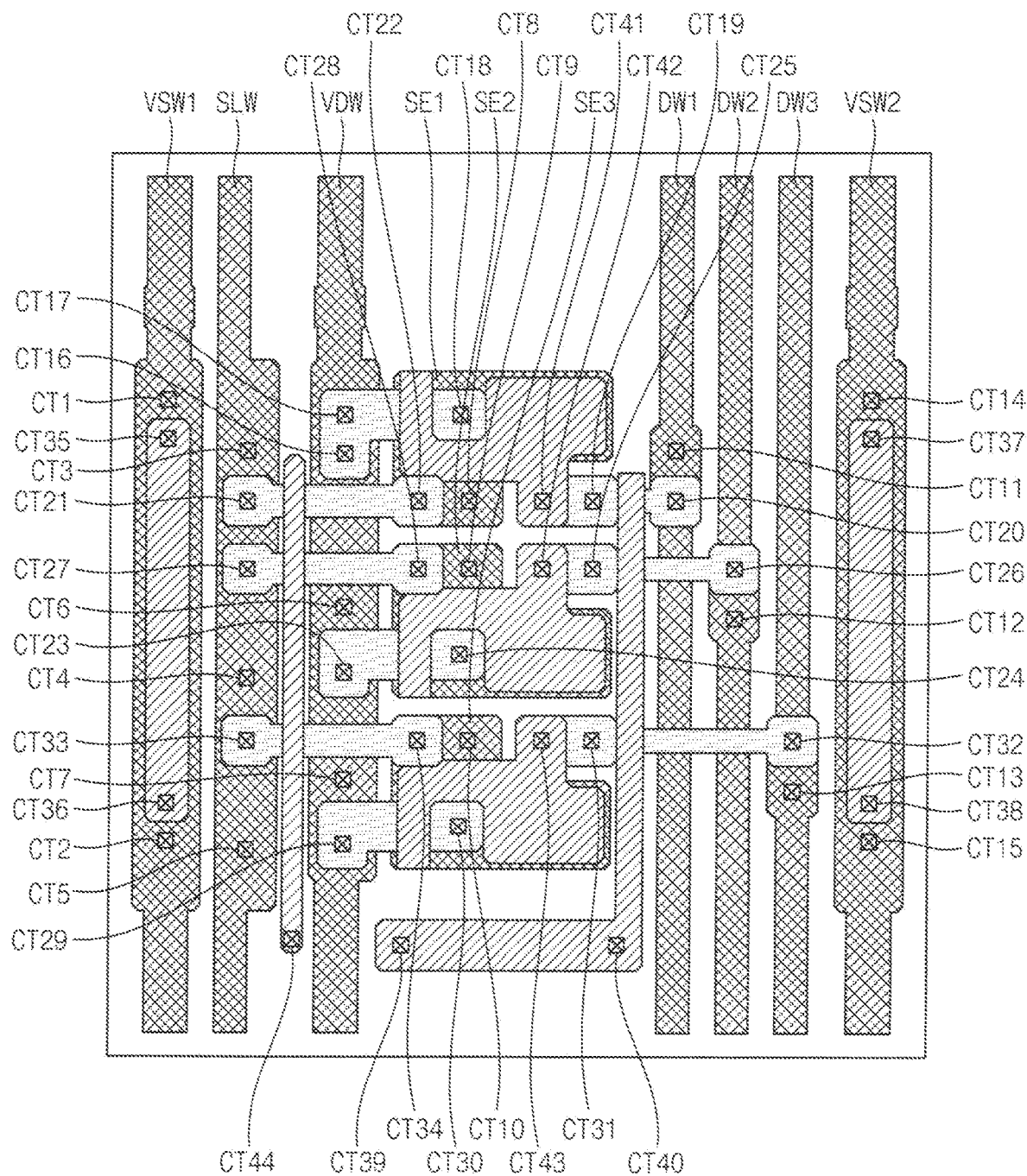
Figure 7G:
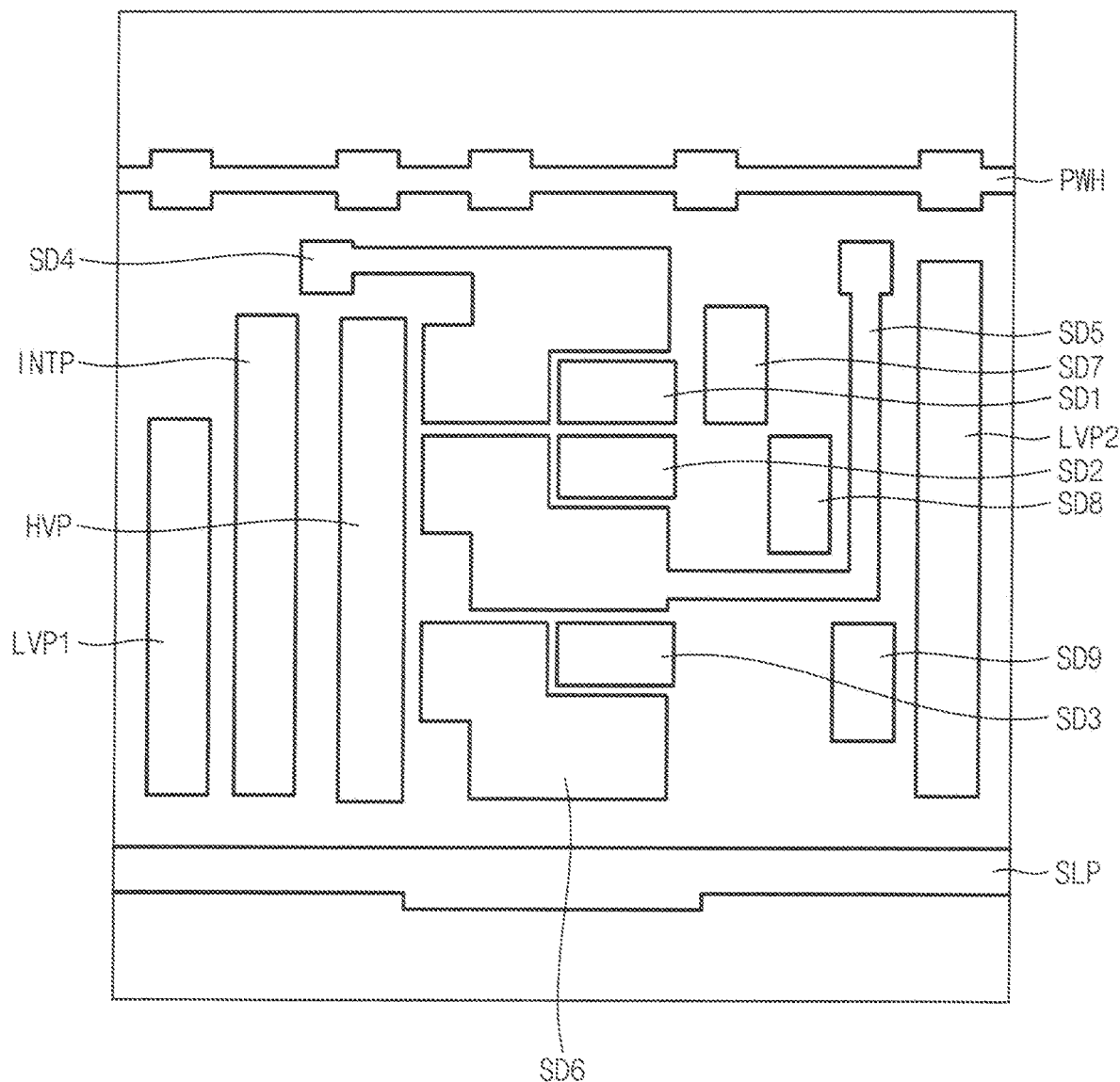
Figure 7H:
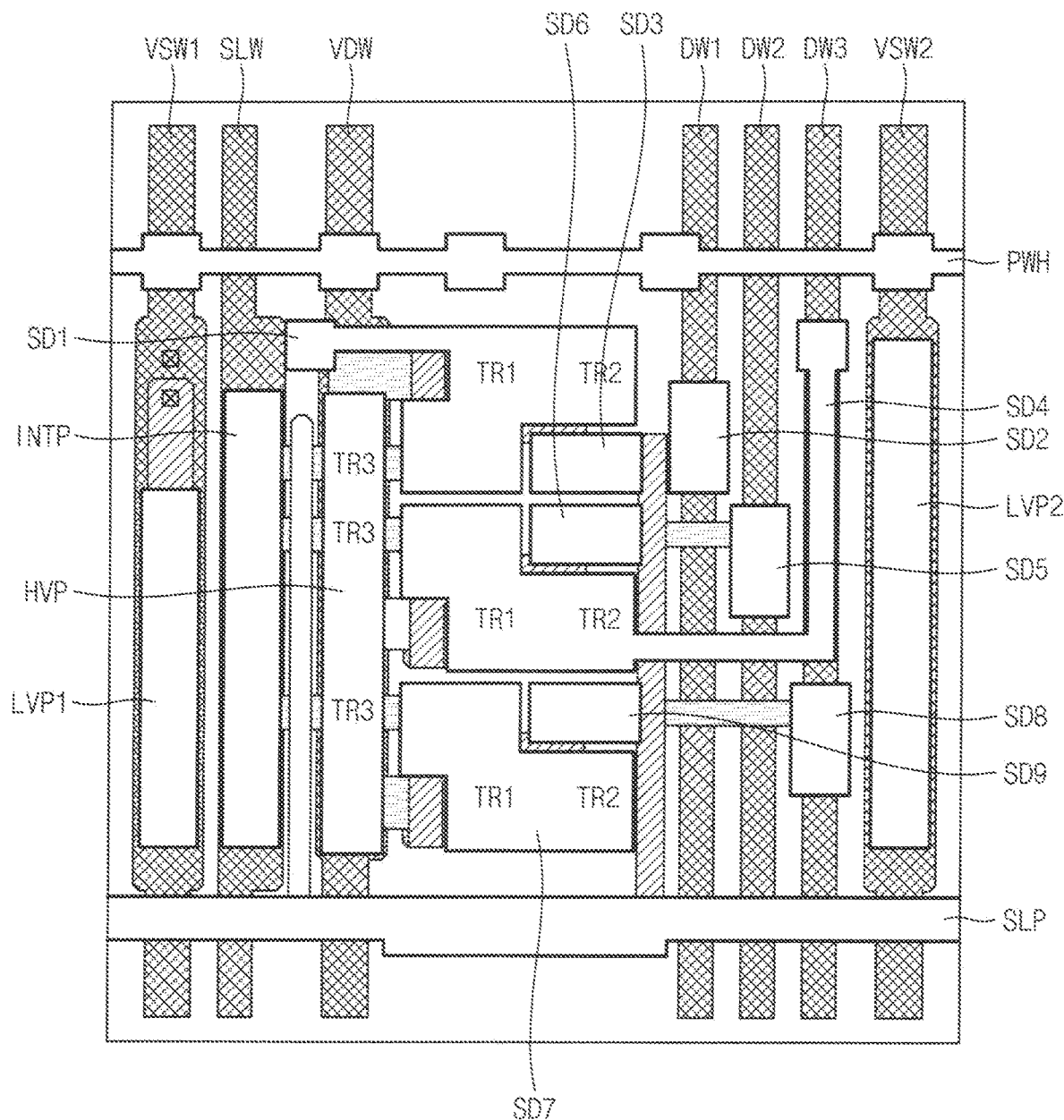
Figure 7I:
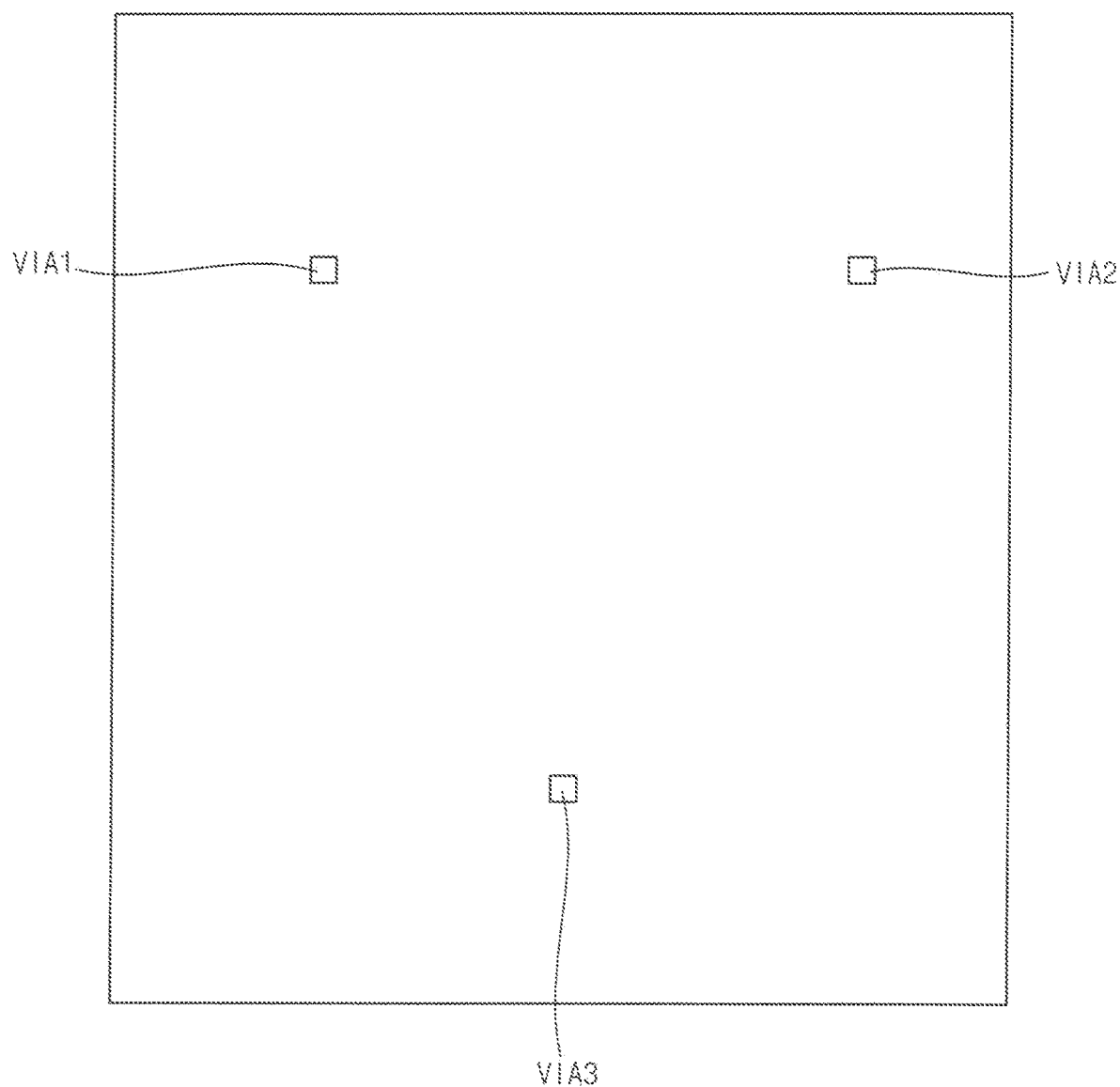
Figure 7J:
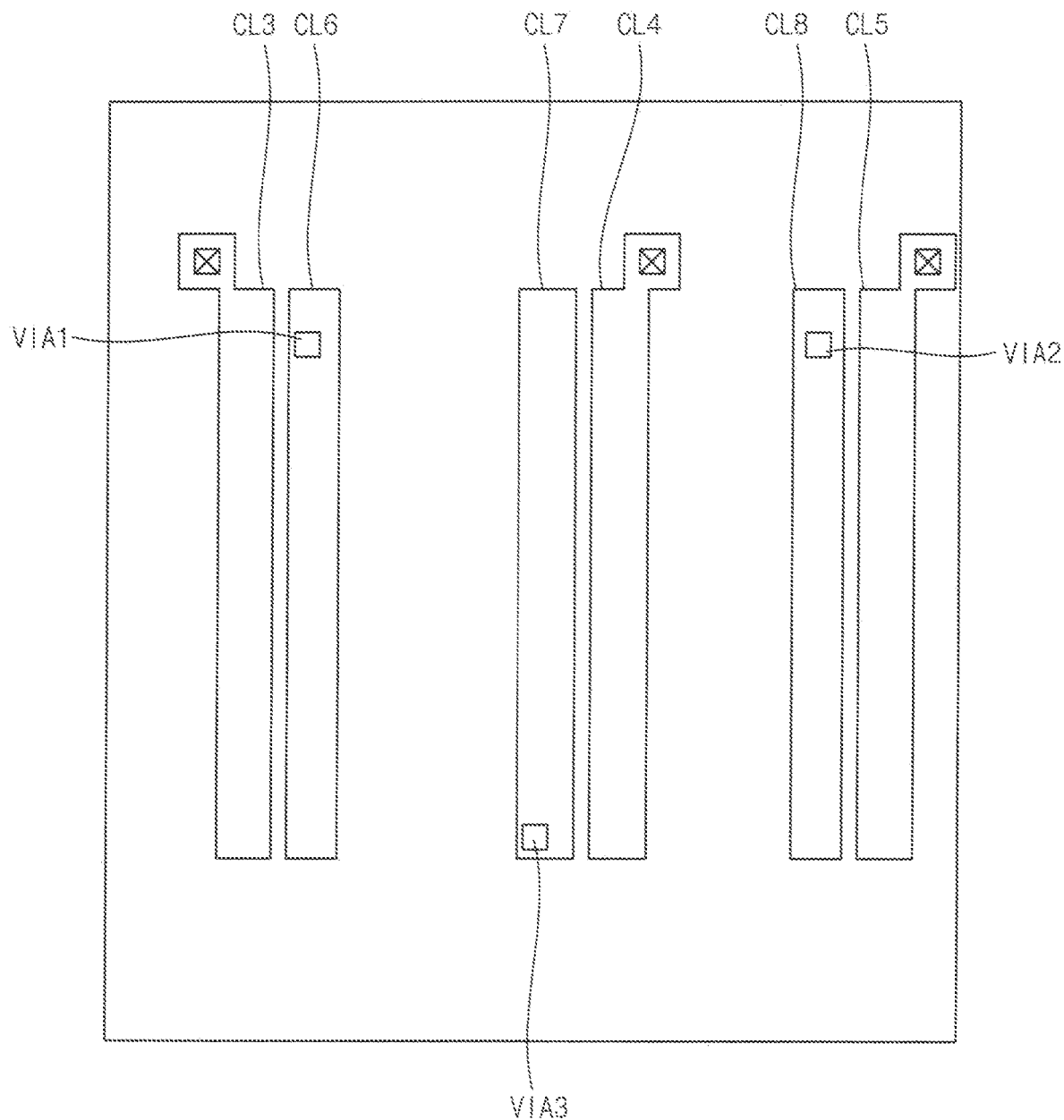
Figure 7K:
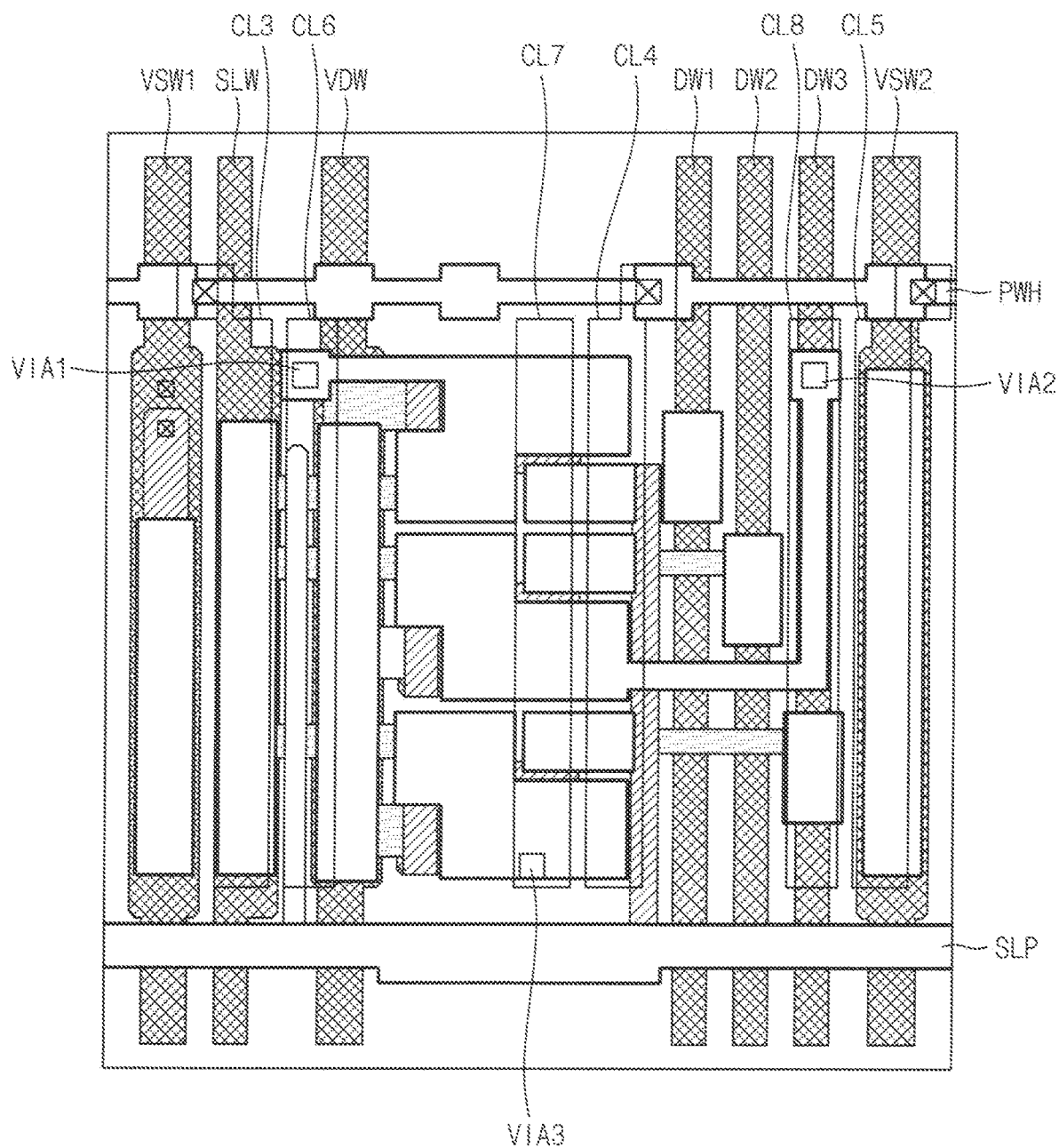
Figure 7L:
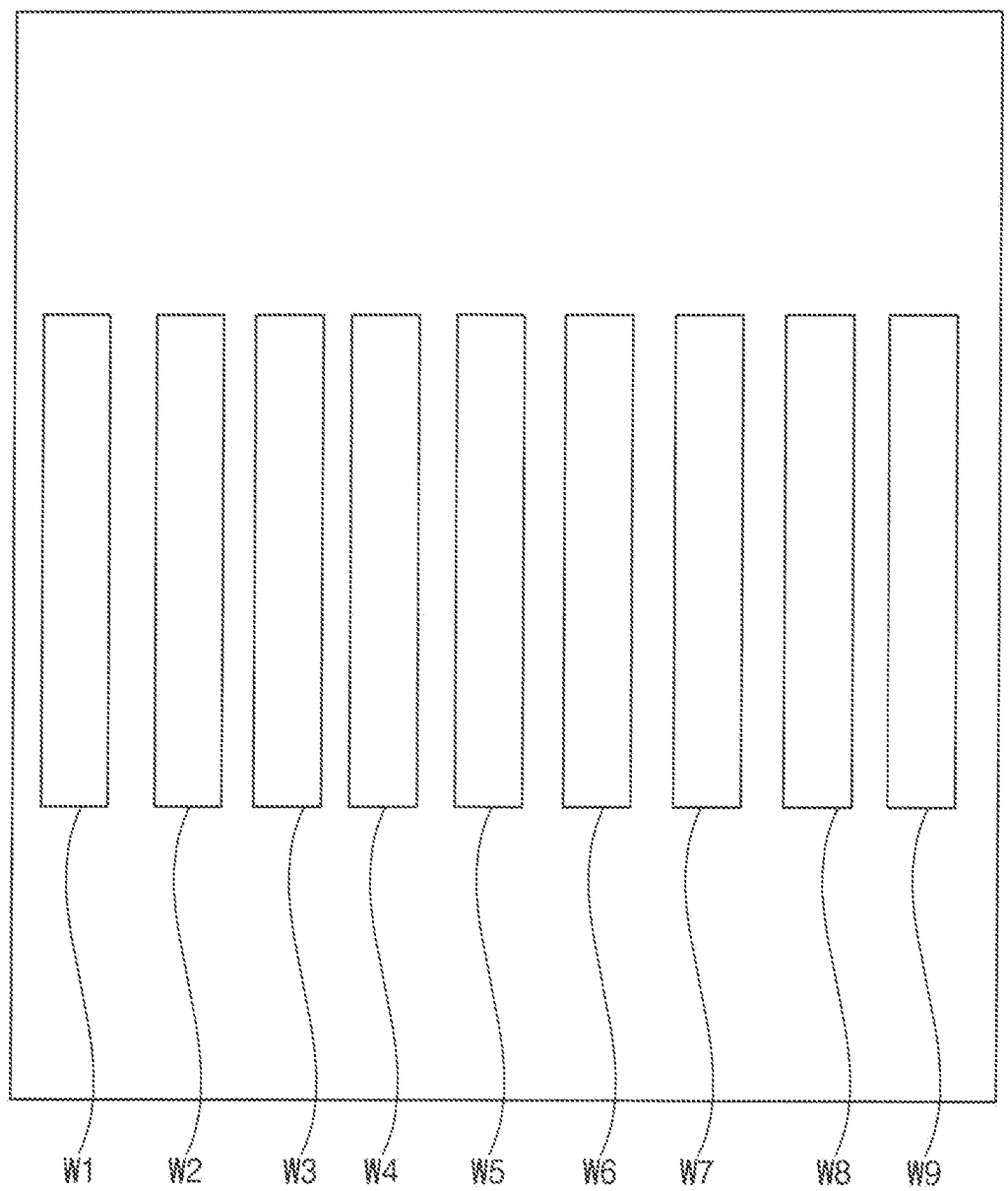
Figure 7M:
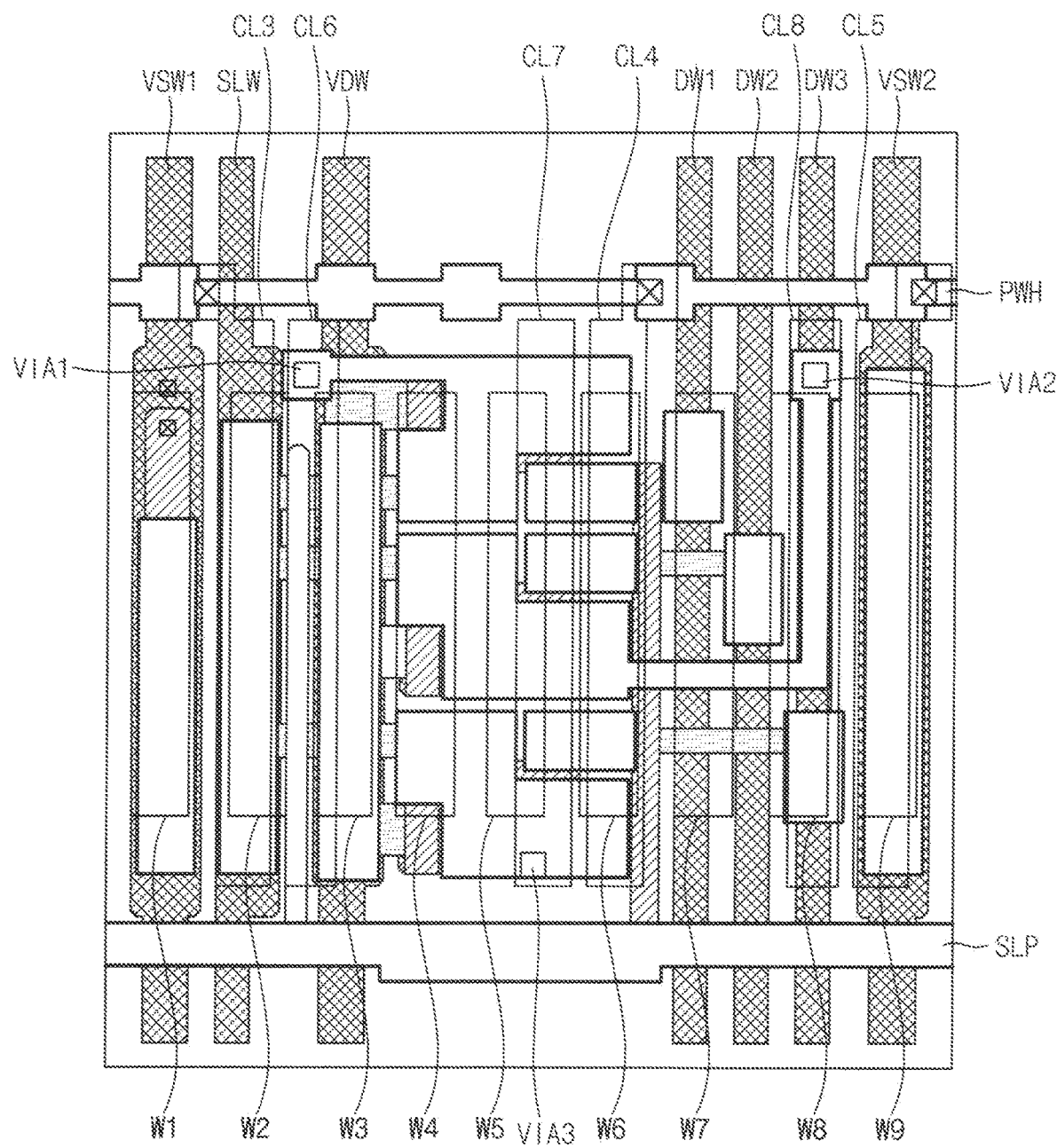
Figure 7N:
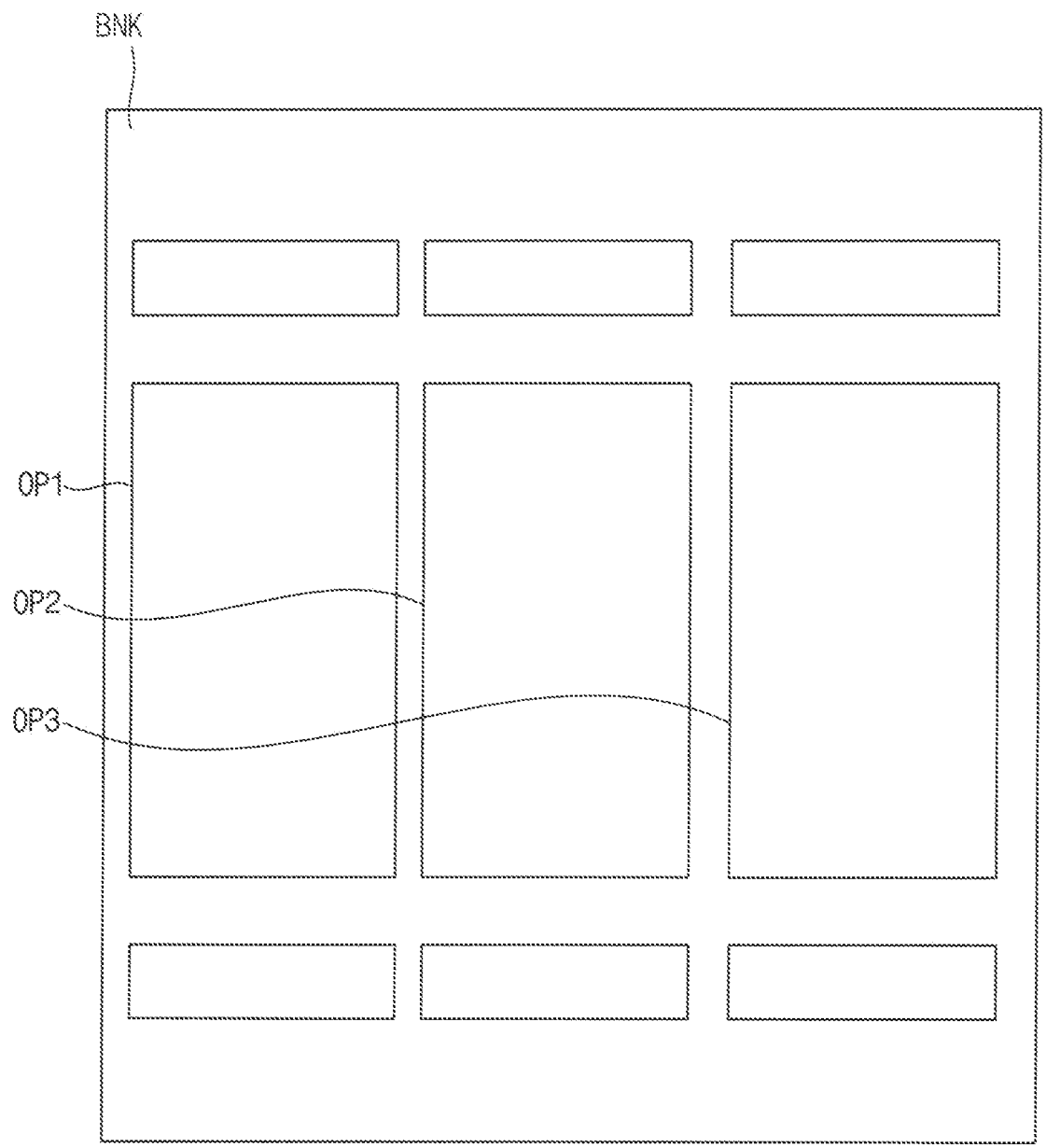
Figure 70:
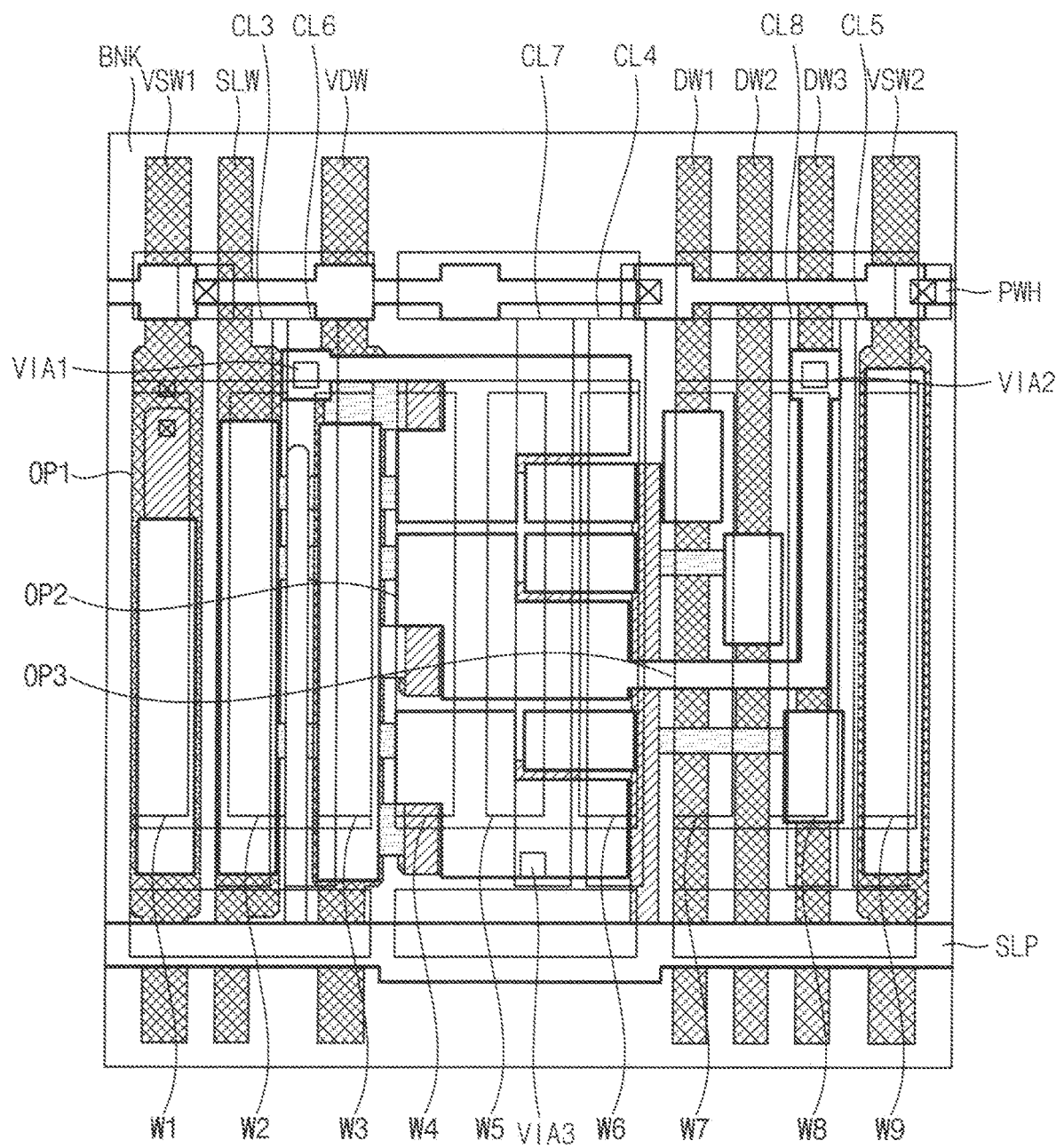
Figure 7P:
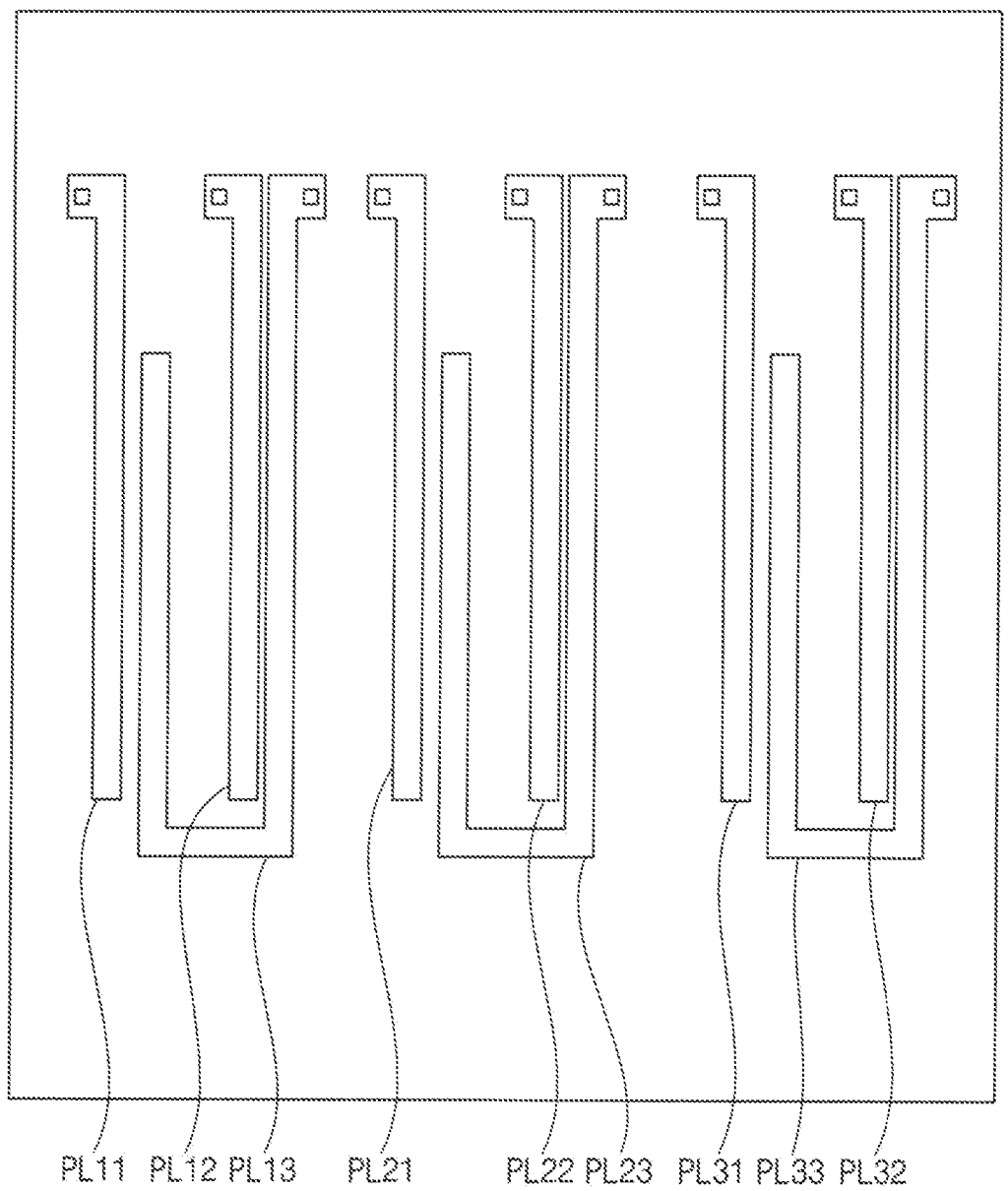
Figure 7Q:
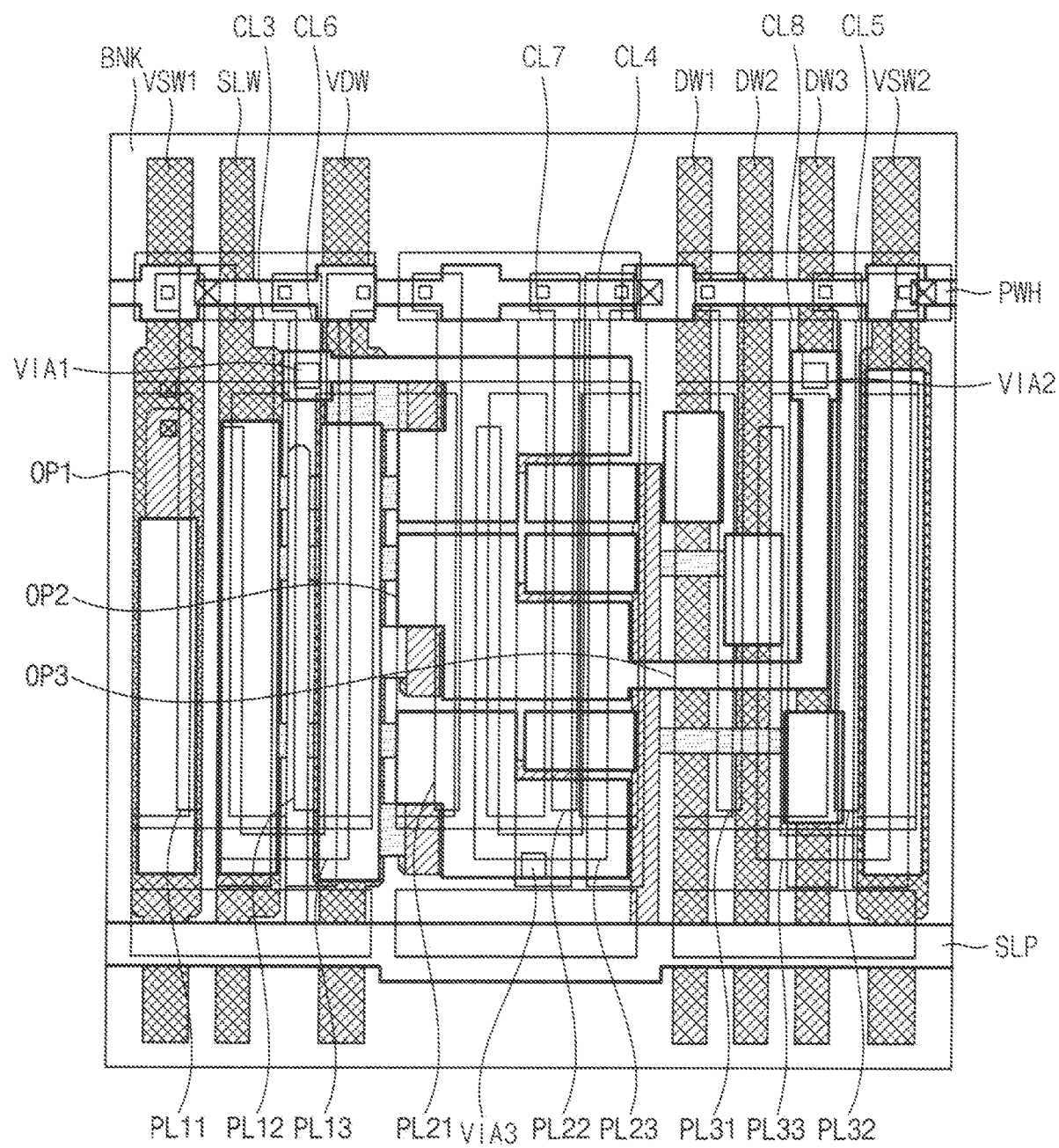
Figure 7R:
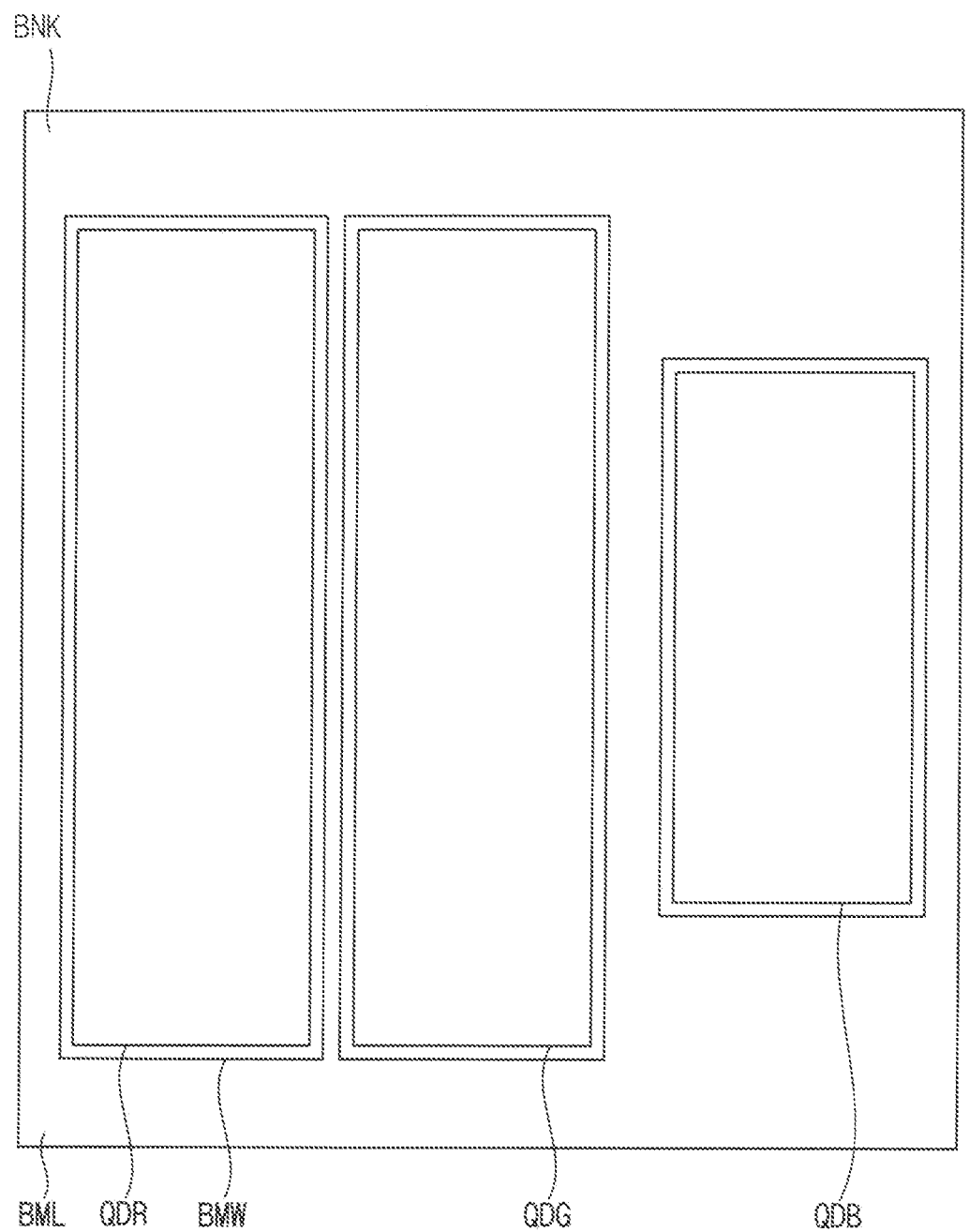
Figure 7S:
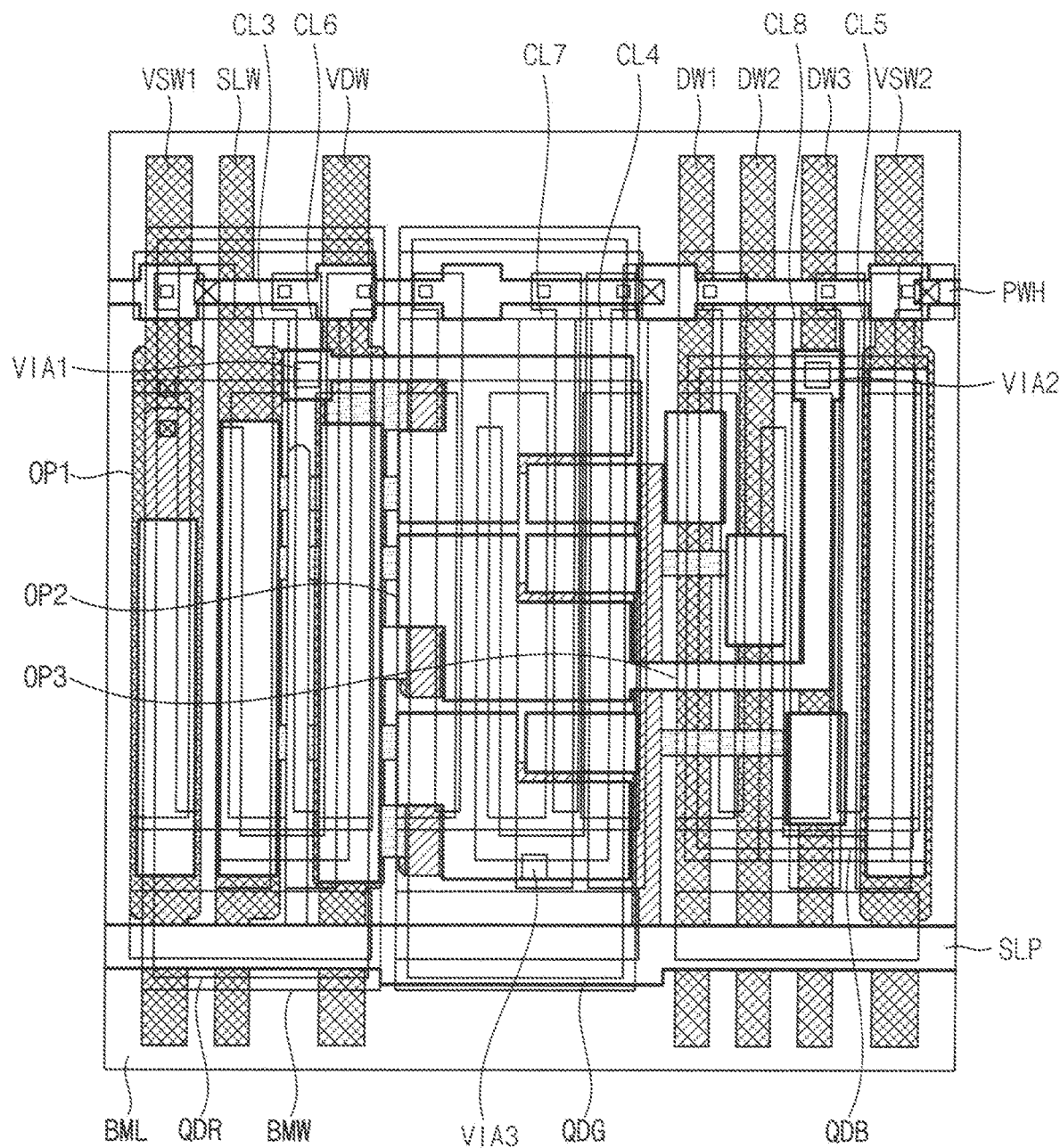

FIG. 7A to FIG. 7S are plan views illustrating a method of manufacturing the pixel shown in FIG. 4.

Referring to FIG. 7A, a first conductive film, or first conductive layer, may be formed on a substrate. The substrate may be made of a transparent glass material, and may contain alkaline earth ions. A buffer layer containing one of silicon nitride (SiNx) and silicon oxide (SiOx) as a main component may be further formed on the upper surface of the substrate. The first conductive layer may be made of a highly conductive metal material used as an electrode material. The highly conductive metal material may include an alloy containing materials such as Al, Ti, Mo, Ag, Cr, Mo, and/or Cu, and may have a single layer or a multilayer structure of the material.

The first conductive layer may be patterned to have a conductive pattern by a photo process using a first photo mask. A general photolithography process may be applied to the photo process. That is, a first photoresist layer may be formed on the first conductive layer and exposed through a first photo mask. Subsequently, the first conductive film may be patterned with a conductive pattern through development and etching processes, and the first photoresist film remaining on the first conductive film is removed.

The conductive pattern includes various signal wirings, such as a first driving low-voltage wiring VSW1, an initialization wiring SLW, a driving high-voltage wiring VDW, a first storage electrode SE1, a second storage electrode SE2, a third storage electrode SE3, and the first data wiring DW1, the second data wiring DW2, the third data wiring DW3, and the second driving low-voltage wiring VSW2. The first driving low-voltage wiring VSW1 provides a driving low-voltage to one side of a unit pixel, and the second driving low-voltage wiring VSW2 provides a driving low-voltage to another side of the unit pixel. The first data wiring DW1 may transfer, for example, red data to the first sub-pixel, and the second data wiring DW2 may transfer, for example, green data to the second sub-pixel, and the wiring third data DW3 may transfer, for example, blue data to the third sub-pixel.

Referring to FIG. 7B and FIG. 7C, an active layer is formed after forming a first insulation layer on a substrate to cover the conductive pattern. The active layer may include any one of amorphous silicon, polycrystalline silicon, and/or oxide semiconductor.

In some embodiments, the active layer includes a first active pattern AP11, a second active pattern AP12, a third active pattern AP13, a fourth active pattern AP21, a fifth active pattern AP22, a sixth active pattern AP23, a seventh active pattern AP31, an eighth active pattern AP32, and a ninth active pattern AP33.

The first active pattern AP11 forms a channel layer of the first thin-film transistor provided in the first sub-pixel, the second active pattern AP12 forms a channel layer of a second thin-film transistor provided in the first sub-pixel, and the third active pattern AP13 forms a channel layer of a third thin-film transistor provided in the first sub-pixel. The fourth active pattern AP21 forms a channel layer of the first thin-film transistor provided in the second sub-pixel, the fifth active pattern AP22 forms a channel layer of a second thin-film transistor provided in the second sub-pixel, and the sixth active pattern AP23 forms a channel layer of the third thin-film transistor provided in the second sub-pixel. The seventh active pattern AP31 forms a channel layer of the first thin-film transistor provided in the third sub-pixel, the eighth active pattern AP32 forms a channel layer of the second thin-film transistor provided in the third sub-pixel, and the ninth active pattern AP33 forms a channel layer of the third thin-film transistor provided in the third sub-pixel.

Referring to FIG. 7D and FIG. 7E, a semiconductor layer ACT and a first gate insulation layer GI are formed on the resultant material shown in FIG. 7C, and then a second conductive layer is applied. Here, the first gate insulation layer GI may include an inorganic insulating material such as silicon nitride (SiNx), silicon oxide (SiOx), and/or silicon oxynitride (SiOxNy). The first gate insulation layer GI may have a single layer structure or a multilayer structure of the above-described material. The second conductive layer may be made of a highly conductive metal material used as an electrode material. The highly conductive metal material may include an alloy containing materials such as Al, Ti, Mo, Ag, Cr, Mo and Cu, and may have a single layer or a multilayer structure of the material. By patterning the second conductive layer, a first power connection pattern PCP1, a second power connection pattern PCP2, a first gate electrode pattern GEP1, a second gate electrode pattern GEP2, a third gate electrode pattern GEP3, a fourth gate electrode pattern GEP4, and a fifth gate electrode pattern GEP5 are formed.

The first power connection pattern PCP1 and the second power connection pattern PCP2 extend in a vertical direction to be located to surround, or partially surround, the first gate electrode pattern GEP1, the second gate electrode pattern GEP2, the third gate electrode pattern GEP3, and the fourth gate electrode pattern GEP4.

The first gate electrode pattern GEP1 forms a gate electrode of the first thin-film transistor of the first sub-pixel. The second gate electrode pattern GEP2 forms a gate electrode of the first thin-film transistor of the second sub-pixel. The third gate electrode pattern GEP3 forms a gate electrode of the first thin-film transistor of the third sub-pixel. The fourth gate electrode pattern GEP4 forms a gate electrode of the third thin-film transistor of the first sub-pixel, a gate electrode of the third thin-film transistor of the second sub-pixel, and a gate of the third thin-film transistor of the third sub-pixel.

When viewed from a plane, the fifth gate electrode pattern GEP5 is formed in an inverted L-shape. When viewed from the top, a vertical extension portion of the fifth gate electrode pattern GEP5 is located between the second power connection pattern PCP2 and the first to third gate electrode patterns GEP3, and a horizontal extension of the fifth gate electrode pattern GEP5 is located under the third gate electrode pattern GEP3.

The fifth gate electrode pattern GEP5 forms a gate electrode of the second thin-film transistor of the first sub-pixel, a gate electrode of the second thin-film transistor of the second sub-pixel, and a gate electrode of the second thin-film of the third sub-pixel.

Referring to FIG. 7F, a second insulation layer is formed on the second conductive layer to cover the first power connection pattern PCP1, the second power connection pattern PCP2, the first gate electrode pattern GEP1, the second gate electrode pattern GEP2, the third gate electrode pattern the GEP3, the fourth gate electrode pattern GEP4, and the fifth gate electrode pattern GEP5.

Then, the second insulation layer is patterned to form a plurality of contact holes using a photolithography process and an etching process.

For example, a first contact hole CT1 and a second contact hole CT2 exposing a partial area of the first driving low-voltage wiring VSW1, and a third contact hole CT3, a fourth contact hole CT4, and a fifth contact hole CT5 exposing a partial area of the initialization wiring SLW are formed.

Moreover, a sixth contact hole CT6 and a seventh contact hole CT7 exposing a partial area of the driving high-voltage wiring VDW, an eighth contact hole CT8 exposing a partial area of the first storage electrode SE1, and a ninth contact hole CT9 exposing a partial area of the second storage electrode SE2 are formed.

In addition, a tenth contact hole CT10 exposing a partial portion of the third storage electrode SE3, an eleventh contact hole CT11 exposing a partial portion of the first data wiring DW1, and a twelfth contact hole CT12 exposing a partial portion of the second data wiring DW2 are formed.

In addition, a thirteenth contact hole CT13 exposing a partial area of the third data wiring DW3, and a fourteenth contact hole CT14 and a fifteenth contact hole CT15 exposing a partial area of the second driving low-voltage wiring VSW2 are formed.

In addition, a sixteenth contact hole CT16, a seventeenth contact hole CT17, and an eighteenth contract hole CT18 exposing a partial area of the first active pattern AP11, a nineteenth contact hole CT19 and a twentieth contact hole CT20 exposing a partial area of the second active pattern AP12, and a twenty-first contact hole CT21 and a twenty-second contact hole CT22 exposing a partial area of the third active pattern AP13 are formed.

In addition, a twenty-third contact hole CT23 and a twenty-fourth contact hole CT24 exposing a partial area of the fourth active pattern AP21, a twenty-fifth contact hole CT25 and a twenty-sixth contact hole CT26 exposing a partial area of the fifth active pattern AP22, and a twenty-seventh contact hole CT27 and a twenty-eighth contact hole CT28 exposing a partial area of the sixth active pattern AP23 are formed.

In addition, a twenty-ninth contact hole CT29 and a thirtieth contact hole CT30 exposing a partial area of the seventh active pattern AP31, a thirty-first contact hole CT31 and a thirty-second contact hole CT32 exposing a partial area of the eighth active pattern AP32, and a thirty-third contact hole CT33 and a thirty-fourth contact hole CT34 exposing a partial area of the ninth active pattern AP33 are formed.

In addition, a thirty-fifth contact hole CT35 and a thirty-sixth contact hole CT36 exposing a partial area of a first power connection pattern PCP1, a thirty-seventh contact hole CT37 and a thirty-eighth contact hole CT38 exposing a partial area of a second power connection pattern PCP2, and a thirty-ninth contact hole CT39 and a fortieth contact hole CT40 exposing a partial area of a fifth gate electrode GEP5 are formed.

In addition, a forty-first contact hole CT41 exposing a partial area of a first gate electrode GEP1, and a forty-second contact hole CT42 exposing a partial area of a second gate electrode GEP2 are formed.

In addition, a forty-third contact hole CT43 exposing a partial area of a third gate electrode GEP3, and a forty-fourth contact hole CT44 exposing a partial area of a fourth gate electrode GEP4 are formed.

Referring to FIG. 7G and FIG. 7H, after applying a third conductive layer on the second insulation layer, a conductive pattern is formed by patterning the third conductive layer. Here, the third conductive layer may be made of a highly conductive metal material used as an electrode material. The highly conductive metal material may include an alloy containing materials such as Al, Ti, Mo, Ag, Cr, Mo, and/or Cu, and may have a single layer or a multilayer structure of the material. The conductive pattern may be formed by a general photolithography process and an etching process.

That is, after applying a third conductive film on the second insulating film, a fifth resist film is applied on the third conductive film. The fifth resist film is exposed and developed using a fourth photo mask to expose an area (e.g., a predetermined area) of the third conductive film, and then the exposed third conductive film is etched. Subsequently, by removing the remaining fifth resist film, a third conductive film of a conductive pattern is obtained.

The conductive pattern includes a first low-voltage connection pattern LVP1, a second low-voltage connection pattern LVP2, an initialization connection pattern INTP, a high-voltage connection pattern HVP, a scan wiring pattern SLP, a horizontal power wiring pattern PWH, a first connection electrode SD1, a second connection electrode SD2, a third connection electrode SD3, a fourth connection electrode SD4, a fifth connection electrode SD5, a sixth connection electrode SD6, a seventh connection electrode SD7, an eighth connection electrode SD8, a ninth connection electrode SD9, a first data connection pattern, a second data connection pattern, and a third data connection pattern.

The first low-voltage connection pattern LVP1, the second low-voltage connection pattern LVP2, the initialization connection pattern INTP, and the high-voltage connection pattern HVP may be extended in a vertical direction.

The scan wiring pattern SLP and the horizontal power wiring pattern PWH extend in a horizontal direction. The horizontal power wiring pattern PWH may be located to connect the first driving low-voltage wiring VSW1 and the second driving low-voltage wiring VSW2 arranged in a vertical direction. Thus, wirings supplying a low-voltage VSS may be formed in a mesh type to provide the low-voltage VSS to a display device.

Meanwhile, the horizontal power wiring pattern PWH may be located to connect the driving high-voltage wirings VDW arranged in a vertical direction. Accordingly, wirings supplying the high-voltage are formed in a mesh type to provide the high-voltage VDD to the display device.

The first connection electrode SD1 is formed to be connected to the second active pattern AP12 and the first gate electrode pattern GEP1 through a ninth contact hole CT19 and a forty-first contact hole CT41.

The second connection electrode SD2 is formed to be connected to the fifth active pattern AP22 and the second gate electrode pattern GEP2 through a twenty fifth contact hole CT25 and a forty-second contact hole CT42.

The third connection electrode SD3 is formed to be connected to the eighth active pattern AP32 and the third gate electrode pattern GEP3 through a thirty first contact hole CT31 and a forty-third contact hole CT43.

The fourth connection electrode SD4 is formed to be connected to the third active pattern AP13 through a twenty second contact hole CT22, to be connected to the first storage electrode SE1 through an eighth contact hole CT8, and to be connected to the first active pattern AP11 through the twelfth contact hole CT18.

The fifth connection electrode SD5 is formed to be connected to the fourth active pattern AP21 through a twenty eighth contact hole CT28, to be connected to the second storage electrode SE2 through a ninth contact hole CT9, and to be connected to the fourth active pattern AP21 through a twenty fourth contact hole CT24.

The sixth connection electrode SD6 is formed to connect to the ninth active pattern AP33 through a thirty fourth contact hole CT34, to be connected to the third storage electrode SE3 through a tenth contact hole CT10, and to be connected to the seventh active pattern AP31 through a thirtieth contact hole CT30.

The seventh connection electrode SD7 connects the first data wiring DW1 and the second active pattern AP12 through an eleventh contact hole CT11 and a twentieth contact hole CT20. The eighth connection electrode SD8 connects the second data wiring DW2 and the fifth active pattern AP22 through a twelfth contact hole CT12 and the twenty-sixth contact hole CT26. The ninth connection electrode SD9 connects the third data wiring DW3 and the eighth active pattern AP32 through a thirteenth contact hole CT13 and a thirty-second contact hole CT32.

Meanwhile, in the structure, the first active pattern AP11, the first gate electrode pattern GEP1, the fourth connection electrode SD4, and the first connection electrode SD1 form a first thin-film transistor T1 of the first sub-pixel. In addition, the second active pattern AP12, the fifth gate electrode pattern GEP5, the first data connection pattern, and the first connection electrode SD1 form a second thin-film transistor T2 of the first sub-pixel. In addition, the third active pattern AP13, the fourth gate electrode pattern GEP4, the initialization connection pattern INTP, and the high-voltage connection pattern HVP form a third thin-film transistor T3 of the first sub-pixel.

Similarly, a first thin-film transistor T1, a second thin-film transistor T2, and a third thin-film transistor T3 of the second sub-pixel are formed.

Referring to FIG. 7I, FIG. 7J, and FIG. 7K, after forming a third insulation layer on the resultant product shown in FIG. 7H, the third insulation layer is patterned using a known photolithography process and an etching process to form via holes VIA1, VIA2, and VIA3 exposing drain electrodes of driving transistors. In some embodiments, a first via hole VIA1 exposes a drain electrode of a driving transistor provided in the first sub-pixel, a second via hole VIA2 exposes a drain electrode of a driving transistor provided in the second sub-pixel, and a third via hole VIA3 exposes a drain electrode of a driving transistor provided in the third sub-pixel.

Subsequently, after forming a fourth conductive layer, the fourth conductive layer is patterned by a photo process using a photo mask to form a first low-power voltage connection wiring CL3, a second low-power voltage connection wiring CL4, a third low-power voltage connection wiring CL5, a first high-power voltage connection wiring CL6, a second high-power voltage connection wiring CL7, and a third high-power voltage connection wiring CL8. Here, the fourth conductive layer may be made of a highly conductive metal material used as an electrode material. The highly conductive metal material may include an alloy containing materials such as Al, Ti, Mo, Ag, Cr, Mo, and/or Cu, and may have a single layer or a multilayer structure of the material.

The first low-power voltage connection wiring CL3, the second low-power voltage connection wiring CL4, and the third low-power voltage connection wiring CL5 are electrically connected to the horizontal power wiring pattern PWH through contact holes. Accordingly, a low-power voltage ELVSS may be applied to the first low-power voltage connection wiring CL3, the second low-power voltage connection wiring CL4, and the third low-power voltage connection wiring CL5. The first low-power voltage connection wiring CL3, the second low-power voltage connection wiring CL4, and the third low-power voltage connection wiring CL5 may be connected to a cathode electrode of a light emitting device. In the embodiments, the light-emitting device may include an organic light-emitting diode (OLED), a quantum-dot organic light-emitting diode (QDOLED), a quantum-dot nano light-emitting diode (QNED), and/or the like.

The first high-power voltage connection wiring CL6 may be electrically connected to the first connection electrode SD1 through the first via hole VIA1. The first high-power voltage connection wiring CL6 may receive a high-power voltage ELVDD from the first connection electrode SD1. The first high-power voltage connection wiring CL6 may be electrically connected to a first anode electrode of a light-emitting device.

The second high-power voltage connection wiring CL7 may be electrically connected to the seventh connection electrode SD7 through the third via hole VIA3. The second high-power voltage connection wiring CL7 may receive a high-power voltage ELVDD from the seventh connection electrode SD7. The second high-power voltage connection wiring CL7 may be electrically connected to a second anode electrode of a light-emitting device.

The third high-power voltage connection wiring CL8 may be electrically connected to the fourth connection electrode SD4 through the second via hole VIA2. The third high-power voltage connection wiring CL8 may receive a high-power voltage ELVDD from the fourth connection electrode SD4. The third high-power voltage connection wiring CL8 may be electrically connected to a third anode electrode of a light-emitting device.

Referring to FIG. 7L and FIG. 7M, a plurality of partition walls is formed in a unit pixel on the result of FIG. 7K. Here, the partition walls may include polyamide. In some embodiments, the partition walls include a first partition wall W1, a second partition wall W2, a third partition wall W3, a fourth partition wall W4, a fifth partition wall W5, a sixth partition wall W6, a seventh partition wall W7, an eighth partition wall W8, and a ninth partition wall W9. The partition walls are formed in a unit pixel in a vertical direction when viewed from a plan view. A reflective metal layer is formed on upper surfaces and sidewalls of the first to ninth partition walls W1, W2, W3, W4, W5, W6, W7, W8, and W9. Holes may be formed in the partition walls to contact the reflective metal layer and the connection electrode formed under the partition walls.

Referring to FIG. 7N and FIG. 7O, a first passivation layer and a bank BNK are formed on a resultant product shown in FIG. 7M. Here, the first passivation layer may include silicon oxide (SiOx), and the bank BNK may include polyamide.

The first passivation layer is partially formed to cover a valley defined by partition walls adjacent to each other.

The bank BNK includes a first opening OP1 formed to open an area corresponding to a first sub-pixel, a second opening OP2 formed to open an area corresponding to a second sub-pixel, and a third opening OP3 formed to open an area corresponding to a third sub-pixel.

After forming the first passivation layer and the bank BNK, nano-sized diodes are located in valleys defined by partition walls adjacent to each other. Here, anode or cathode of the diodes is aligned in the same direction.

Referring to FIG. 7P and FIG. 7Q, a pixel layer and a second passivation layer are formed on a resultant product shown in FIG. 7O. Here, the second passivation layer may include silicon oxide (SiOx).

The pixel layer includes a first pixel line PL11, a second pixel line PL12, a third pixel line PL13, a fourth pixel line PL21, a fifth pixel line PL22, a sixth pixel line PL23, a seventh pixel line PL31, an eighth pixel line PL32, and a ninth pixel line PL33. The first to third pixel lines PL11, PL12, and PL13 are formed in the first sub-pixel area, the fourth to sixth pixel lines PL21, PL22, and PL23 are formed in the second sub-pixel area, and the seventh to ninth pixel lines PL31, PL32, and PL33 are formed in the third sub-pixel area.

When viewed from a plane, the first pixel line PL11 and the second pixel line PL12 have an I-shape, and the third pixel line PL13 has a U-shape surrounding or partially surrounding the second pixel line PL12. When viewed from a plan view, the first pixel line PL11 is formed on a portion of an upper surface and a right wall of the first partition wall W1, and the second pixel line PL12 is formed on a portion of an upper surface and a right wall of the second partition wall W2. The third pixel line PL13 is formed on a portion of an upper surface and a left wall of the second partition wall W2, and is formed on a portion of an upper surface and a left wall of the third partition wall W3. Accordingly, a first width of the first to third pixel lines PL11, PL12, and PL13 is in contact with the reflective metal layer formed on the upper surfaces of the partition walls, and a second width of the first to third pixel lines PL11, PL12, and PL13 is in contact with nano-sized diodes located in valley spaces between adjacent partition walls.

When viewed from a plane, the fourth pixel line PL21 and the fifth pixel line PL22 have an I-shape, and the sixth pixel line PL23 has a U-shape surrounding or partially surrounding the fifth pixel line PL22. When viewed from a plan view, the fourth pixel line PL21 is formed on a portion of an upper surface and a right wall of the fourth partition wall W4, and the fifth pixel line PL22 is formed on a portion of an upper surface and a right wall of the fifth partition wall W5. The sixth pixel line PL23 is formed on a portion of an upper surface and a left wall of the fifth partition wall W2, and is formed on a portion of an upper surface and a left wall of the sixth partition wall W6. Accordingly, a first width of the fourth to sixth pixel lines PL21, PL22, and PL23 is in contact with the reflective metal layer formed on the upper surfaces of the partition walls, and a second width of the fourth to sixth pixel lines PL21, PL22, and PL23 is in contact with nano-sized diodes located in valley spaces between adjacent partition walls.

When viewed from a plane, the seventh pixel line PL31 and the eighth pixel line PL32 have an I-shape, and the ninth pixel line PL33 has a U-shape surrounding or partially surrounding the eighth pixel line PL32. When viewed from a plan view, the seventh pixel line PL31 is formed on a portion of an upper surface and a right wall of the seventh partition wall W7, and the eighth pixel line PL32 is formed on a portion of an upper surface and a right wall of the eighth partition wall W8. The ninth pixel line PL33 is formed on a portion of an upper surface and a left wall of the eighth partition wall W8, and is formed on a portion of an upper surface and a left wall of the ninth partition wall W9. Accordingly, a first width of the seventh to ninth pixel lines PL31, PL32, and PL33 is in contact with the reflective metal layer formed on the upper surfaces of the partition walls, and a second width of the seventh to ninth pixel lines PL31, PL32, and PL33 is in contact with nano-sized diodes located in valley spaces between adjacent partition walls.

A second passivation layer is formed between adjacent pixel lines to cover diodes located in valley spaces between adjacent partition walls. The second passivation layer may block contact between different pixel lines on the diode.

In some embodiments, a metal reflective layer formed on one partition wall is connected to a drain electrode of a lower thin-film transistor through a hole formed in a corresponding partition wall, and a metal reflective layer formed on another partition wall is connected to a lower voltage connection pattern through a hole formed in a corresponding partition wall. Accordingly, one terminal of a diode located in a valley space between the partition walls adjacent to each other is connected to a drain electrode of a thin-film transistor through a pixel line and a metal reflective layer formed corresponding to one partition wall. Moreover, another terminal of the diode located in the valley space between the partition walls adjacent to each other is connected to a low-voltage connection pattern through a pixel line and a metal reflective layer formed corresponding to another partition wall.

Referring to FIG. 7R and FIG. 7S, a light-blocking layer BML in which a plurality of light-blocking windows BMW are formed and a quantum dot layer including a red quantum dot QDR, a green quantum dot QDG, and a blue quantum dot QDB corresponding to each of the light-blocking windows BMW are formed on a result of FIG. 7Q. Here, a quantum dot (QD) is an ultrafine semiconductor particle having a diameter of about 2-10 nanometers, and refers to a particle having unusual electrical and optical properties. For example, quantum dot particles emit light of a corresponding frequency when exposed to light. These quantum dots display bright areas brighter and dark areas more detailed and precise. The wavelength of the emitted light also varies depending on the size, thus realizing high color realization. Moreover, it may also reduce power consumption.

The light-blocking windows BMW formed in the light-blocking layer BML expose pixel lines and areas in which diodes connected to the pixel lines are formed, respectively.

The red quantum dot QDR is formed to cover pixel lines exposed by one light-blocking window BMW and a diode connected to corresponding pixel lines. Here, the diodes may emit blue light. During operation, as blue light is emitted from the diode, the red quantum dot QDR is excited to emit red light.

The green quantum dot QDG is formed to cover pixel lines exposed by one light-blocking window BMW and a diode connected to corresponding pixel lines. During operation, as blue light is emitted from the diode, the green quantum dot QDG is excited to emit green light.

The blue quantum dot QDB is formed to cover pixel lines exposed by one light-blocking window BMW and a diode connected to corresponding pixel lines. During operation, as blue light is emitted from the diode, the blue quantum dot QDB is excited to emit blue light. In some embodiments, an area in which the blue quantum dot QDB is formed is smaller than an area in which the red quantum dot QDR is formed or the green quantum dot QDG is formed.

In some embodiments, after forming the light-blocking layer BML, the red quantum dot QDR, the green quantum dot QDG, and the blue quantum dot QDB, a first planarization layer, a color filter layer, and a second planarization layer may be formed sequentially. The color filter layer may be formed by forming a red color filter layer, a green color filter layer, and a blue color filter layer respectively corresponding to each of sub-pixels.

Figure 8:
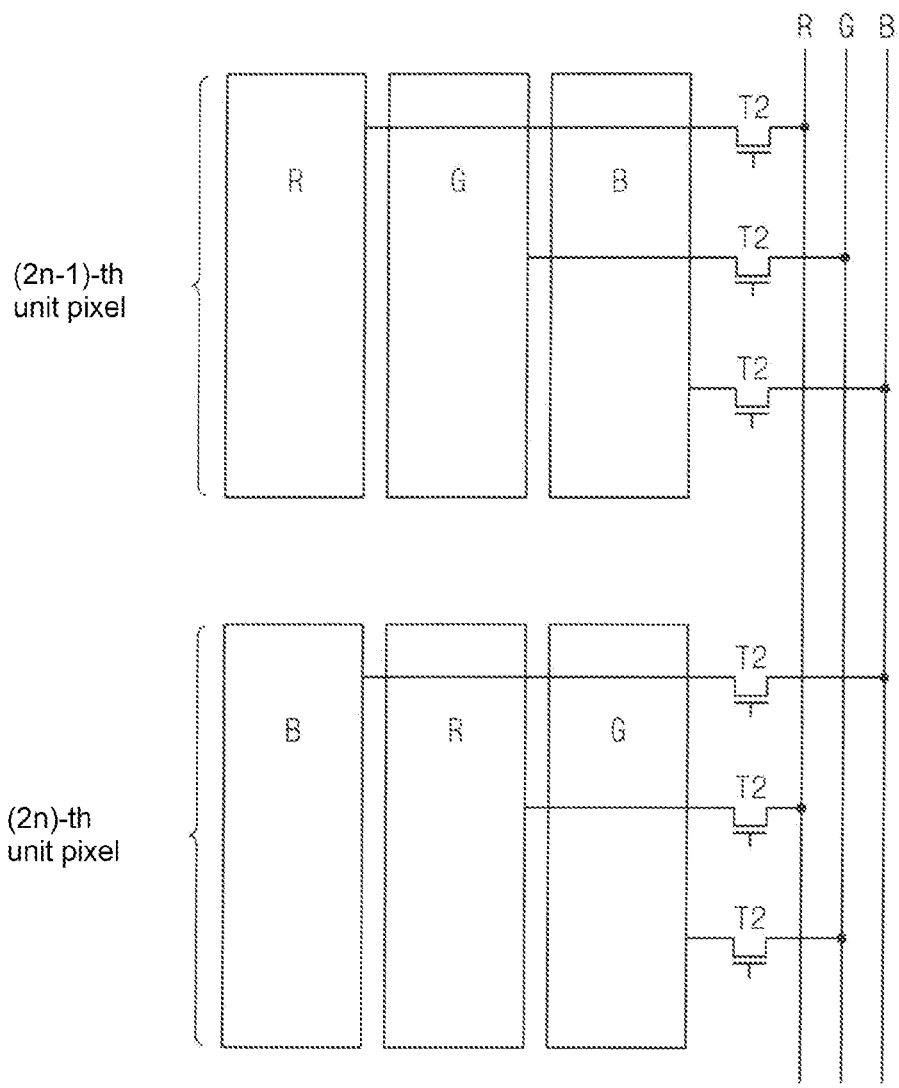
FIG. 8 is a diagram explaining a connection between sub-pixels and data wirings corresponding to the color arrangement illustrated in FIG. 2.

FIG. 8 is a diagram explaining a connection between sub-pixels and data wirings corresponding to the color arrangement illustrated in FIG. 2.

Referring to FIG. 2, FIG. 4, and FIG. 8, a (2n)-th (n is a natural number) unit pixel includes a plurality of sub-pixels arranged in an arrangement order of blue, red, and green, and a (2n−1)-th unit pixel includes a plurality of sub-pixels arranged in an arrangement order of red, green, and blue. Each of the (2n)-th and (2n−1)-th unit pixels is connected to a red data wiring transferring red data, a green data wiring transferring green data, and a blue data wiring transferring blue data. The pixel circuit of each unit pixel, as shown in FIG. 4, includes first, second, and third transistors T1, T2, and T3 and a capacitor Cst, but for convenience of description, a switching transistor T2 is only shown.

In the (2n)-th unit pixel, a blue data applied to a blue data wiring is applied to a blue display element B via a switching transistor T2. In addition, a red data applied to a red data wiring is applied to a red display element R via a switching transistor T2. In addition, a green data applied to a green data wiring is applied to a green display element G via a switching transistor T2.

In the (2n−1)-th unit pixel, a red data applied to a red data wiring is applied to a red display element B via a switching transistor T2. In addition, a green data applied to a green data wiring is applied to a green display element R via a switching transistor T2. In addition, a blue data applied to a blue data wiring is applied to a blue display element B via a switching transistor T2.

In this way, even if an arrangement order of sub-pixels in unit pixels adjacent to each other is alternated, a display operation may be normally performed. Moreover, because display elements emitting different color light are located in a column direction, it is possible to reduce or prevent a single color or spot from being visually recognized.

Figure 9:
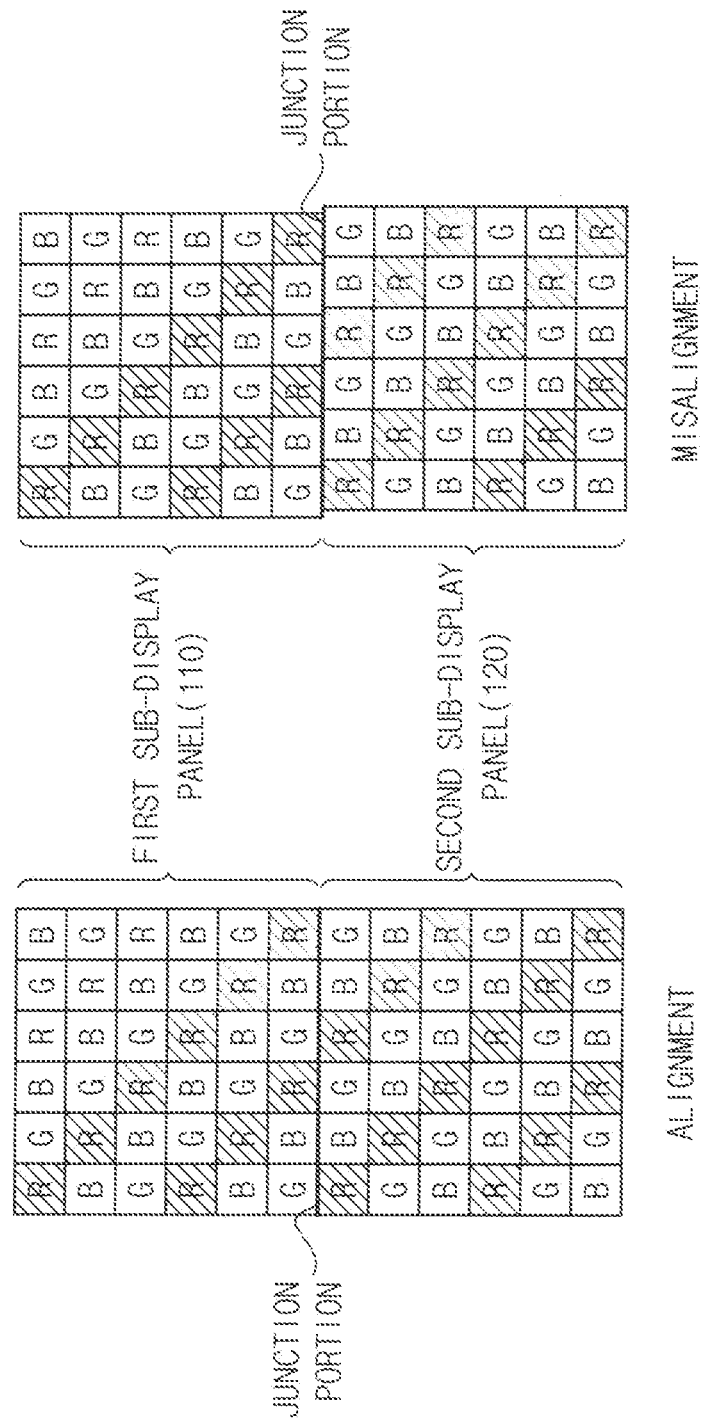
FIG. 9 is a plan view illustrating another example of a color arrangement corresponding to a junction portion of the tiled display device illustrated in FIG. 1.

FIG. 9 is a plan view illustrating another example of a color arrangement corresponding to a junction portion of the tiled display device illustrated in FIG. 1. For example, an example of a color arrangement repeated in 3 cycles is shown. In FIG. 9, a sub-display panel located above the junction portion is, for example, the first sub-display panel 110 shown in FIG. 1, and a sub-display panel located below the junction portion is, for example, the second sub-display panel 120 shown in FIG. 1.

Referring to FIG. 1 and FIG. 9, each of the sub-display panels includes a plurality of unit pixels corresponding to a plurality of wirings. Here, each of the unit pixels corresponding to a (3n)-th row is arranged in an arrangement order of a green sub-pixel, a blue sub-pixel, and a red sub-pixel, each of the unit pixels corresponding to a (3n−1)-th row is arranged in an arrangement order of a blue sub-pixel, a red sub-pixel, and a green sub-pixel, and each of the unit pixels corresponding to a (3n−2)-th row is arranged in an arrangement order of a red sub-pixel, a green sub-pixel, and a blue sub-pixel.

In this way, sub-pixels are arranged to be staggered with each other in unit pixels corresponding to wirings adjacent to each other. In other words, sub-pixels in the unit pixels corresponding to the first row are arranged in the order of arrangement of R-G-B. In addition, sub-pixels in the unit pixels corresponding to the second row are arranged in the order of arrangement of B-R-G. In addition, sub-pixels in the unit pixels corresponding to the third row are arranged in the order of arrangement of G-B-R.

Therefore, even if the second sub-display panel 120 is attached to the first sub-display panel 110 by inverting 180 degrees with respect to the first sub-display panel 110, it is possible to reduce or prevent visibility of spots caused by pixel asymmetry at a junction portion.

In addition, even if the first sub-display panel 110 and the second sub-display panel 120 are misaligned, it is possible to reduce or prevent visibility of spots caused by pixel asymmetry of a junction portion.

Figure 10:
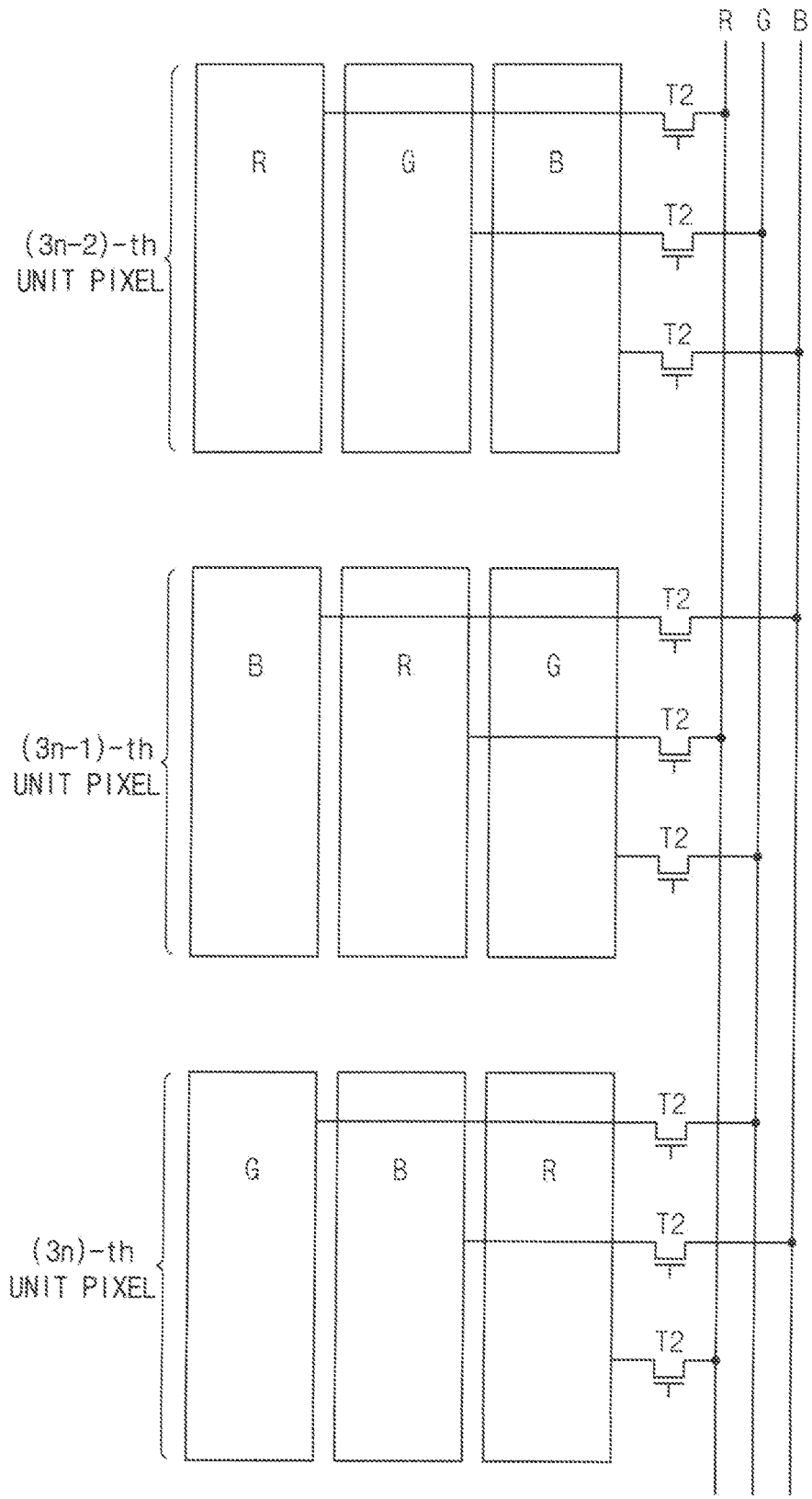
FIG. 10 is a diagram explaining a connection between sub-pixels and data wirings corresponding to the color arrangement illustrated in FIG. 9.

FIG. 10 is a diagram explaining a connection between sub-pixels and data wirings corresponding to the color arrangement illustrated in FIG. 9. For example, sub-pixels and data wirings located on the first sub-display panel shown in FIG. 9 are shown.

Referring to FIG. 9 and FIG. 10, a (3n)-th (n is a natural number) unit pixel includes a plurality of sub-pixels arranged in an arrangement order of green, blue, and red, a (3n−1)-th unit pixel includes a plurality of sub-pixels arranged in an arrangement order of blue, red, and green, a (3n−2)-th unit pixel includes a plurality of sub-pixels arranged in an arrangement order of red, green, and blue. Each of the (3n)-th, (3n−1)-th, and (3n−2)-th unit pixels is connected to a red data wiring transferring red data, a green data wiring transferring green data, and a blue data wiring transferring blue data. The pixel circuit of each unit pixel, as shown in FIG. 4, includes first, second, and third transistors T1, T2, and T3 and a capacitor Cst, but for convenience of description, a switching transistor T2 is only shown.

In the (3n)-th unit pixel, a green data applied to a green data wiring is applied to a green display element G via a switching transistor T2. In addition, a blue data applied to a blue data wiring is applied to a blue display element B via a switching transistor T2. In addition, a red data applied to a red data wiring is applied to a red display element R via a switching transistor T2.

In the (3n−1)-th unit pixel, a blue data applied to a blue data wiring is applied to a blue display element B via a switching transistor T2. In addition, a red data applied to a red data wiring is applied to a red display element R via a switching transistor T2. In addition, a green data applied to a green data wiring is applied to a green display element G via a switching transistor T2.

In the (3n−2)-th unit pixel, a red data applied to a red data wiring is applied to a red display element R via a switching transistor T2. In addition, a green data applied to a green data wiring is applied to a green display element G via a switching transistor T2. In addition, a blue data applied to a blue data wiring is applied to a blue display element B via a switching transistor T2.

In this way, even if an arrangement order of sub-pixels in unit pixels adjacent to each other is alternated, a display operation may be normally performed. Moreover, because display elements emitting different color light are located in a column direction, it is possible to reduce or prevent a single color or spot from being visually recognized.

Figure 11:
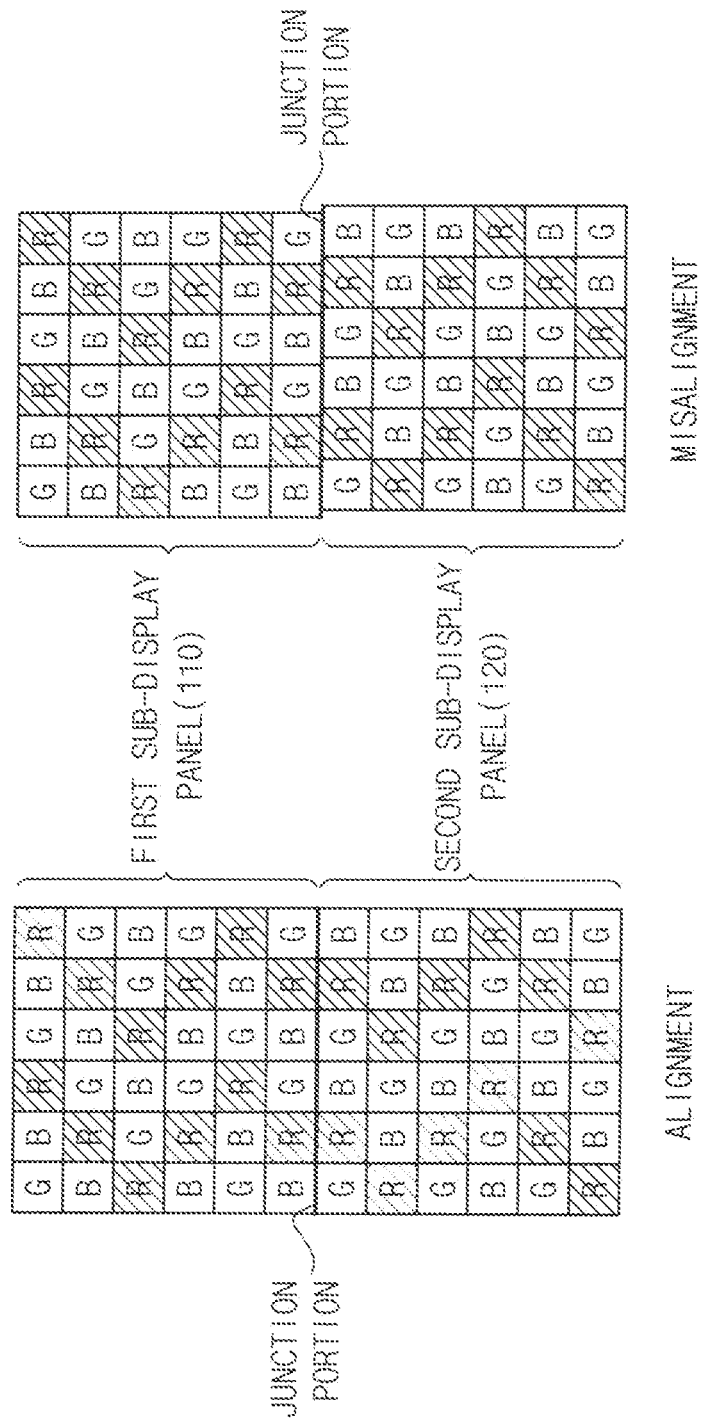
FIG. 11 is a plan view illustrating still another example of color arrangement corresponding to a junction portion of the tiled display device illustrated in FIG. 1.

FIG. 11 is a plan view illustrating still another example of color arrangement corresponding to a junction portion of the tiled display device illustrated in FIG. 1. For example, an example of a color arrangement repeated in 4 cycles is shown. In FIG. 11, the sub-display panel located above the junction portion is, for example, the first sub-display panel 110 shown in FIG. 1, and the sub-display panel located below the junction portion is, for example, the second sub-display panel 120 shown in FIG. 1.

Referring to FIG. 1 and FIG. 11, each of the sub-display panels includes a plurality of unit pixels corresponding to a plurality of wirings. Here, each of the unit pixels corresponding to a (4n)-th row is arranged in an arrangement order of a blue sub-pixel, a red sub-pixel, and a green sub-pixel, and each of the unit pixels corresponding to a (4n−1)-th row is arranged in an arrangement order of a green sub-pixel, a blue sub-pixel, and a red sub-pixel. Moreover, each of the unit pixels corresponding to a (4n−2)-th row is arranged in an arrangement order of a blue sub-pixel, a red sub-pixel, and a green sub-pixel and each of the unit pixels corresponding to a (4n−3)-th row is arranged in an arrangement order of a red sub-pixel, a green sub-pixel and a blue sub-pixel.

In this way, sub-pixels are arranged to be staggered in unit pixels corresponding to wirings adjacent to each other. In other words, sub-pixels are arranged in an arrangement order of B-R-G in the unit pixels corresponding to the first row, and sub-pixels are arranged in an arrangement order of G-B-R in the unit pixels corresponding to the second row. Moreover, sub-pixels are arranged in an arrangement order of B-R-G in the unit pixels corresponding to the third row, and sub-pixels are arranged in an arrangement order of R-G-B in the unit pixels corresponding to the fourth row.

Therefore, even if the second sub-display panel 120 is attached to the first sub-display panel 110 by inverting 180 degrees with respect to the first sub-display panel 110, it is possible to reduce or prevent visibility of spots caused by pixel asymmetry at a junction portion.

In addition, even if the first sub-display panel 110 and the second sub-display panel 120 are misaligned, it is possible to prevent visibility of spots caused by pixel asymmetry of a junction portion.

Figure 12:
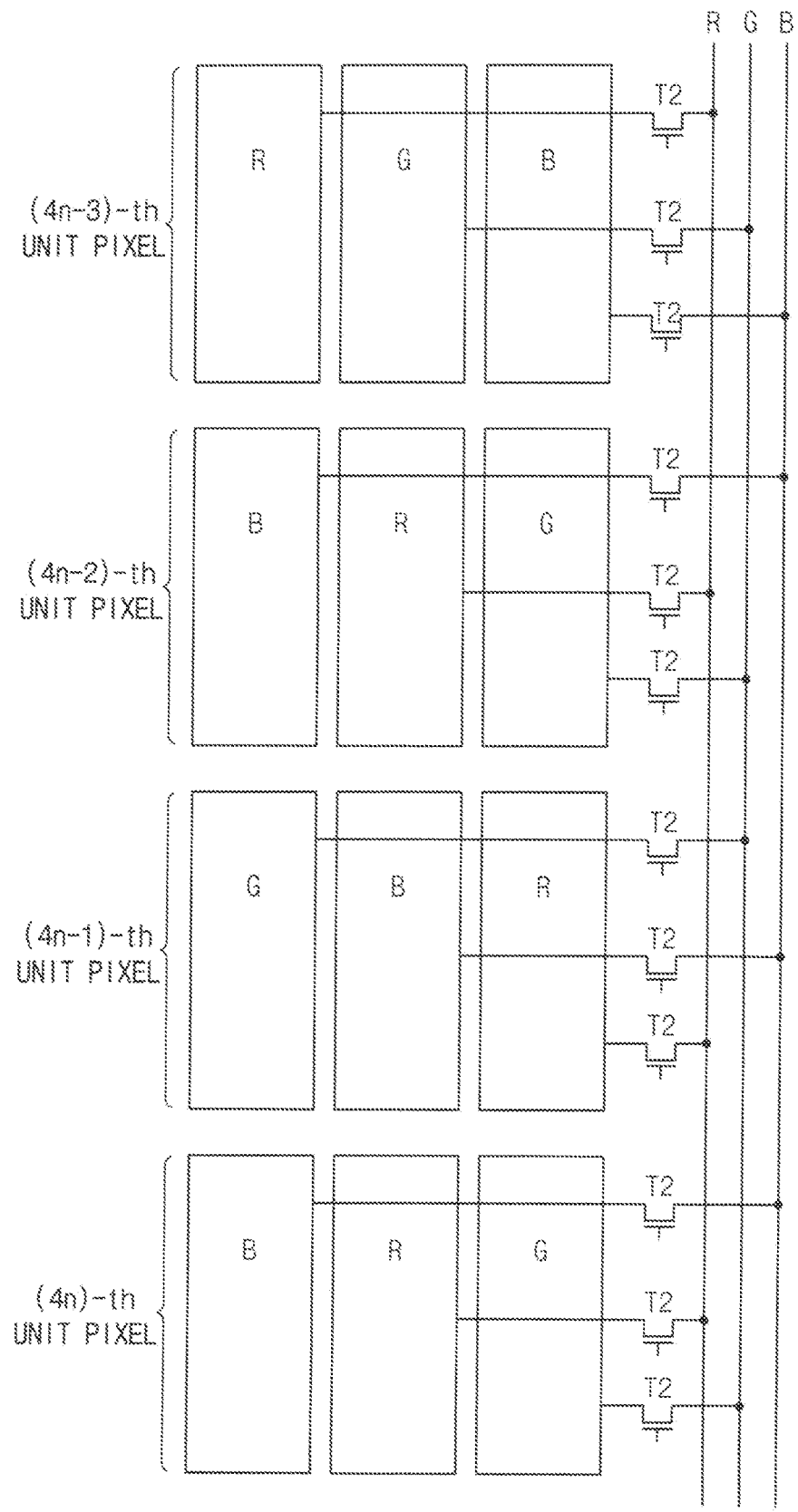
FIG. 12 is a diagram explaining a connection between sub-pixels and data wirings corresponding to the color arrangement illustrated in FIG. 11.

FIG. 12 is a diagram explaining a connection between sub-pixels and data wirings corresponding to the color arrangement illustrated in FIG. 11.

Referring to FIG. 11 and FIG. 12, a (4n)-th (n is a natural number) unit pixel includes a plurality of sub-pixels arranged in an arrangement order of blue, red, and green, and a (4n−1)-th unit pixel includes a plurality of sub-pixels arranged in an arrangement order of green, blue, and red. A (4n−2)-th unit pixel includes a plurality of sub-pixels arranged in an arrangement order of blue, red, and green, and a (4n−3)-th unit pixel includes a plurality of sub-pixels arranged in an arrangement order of red, green, and blue. Each of the (4n)-th, (4n−1)-th, (4n−2)-th, and (4n−3)-th unit pixels is connected to a red data wiring transferring red data, a green data wiring transferring green data, and a blue data wiring transferring blue data. The pixel circuit of each unit pixel, as shown in FIG. 4, includes first, second, and third transistors T1, T2, and T3 and a capacitor Cst, but for convenience of description, a switching transistor T2 is only shown.

In the (4n)-th unit pixel, a blue data applied to a blue data wiring is applied to a blue display element B via a switching transistor T2. In addition, a red data applied to a red data wiring is applied to a red display element R via a switching transistor T2. In addition, a green data applied to a green data wiring is applied to a green display element G via a switching transistor T2.

In the (4n−1)-th unit pixel, a green data applied to a green data wiring is applied to a green display element G via a switching transistor T2. In addition, a blue data applied to a blue data wiring is applied to a blue display element B via a switching transistor T2. In addition, a red data applied to a red data wiring is applied to a red display element R via a switching transistor T2.

In the (4n−2)-th unit pixel, a blue data applied to a blue data wiring is applied to a blue display element B via a switching transistor T2. In addition, a red data applied to a red data wiring is applied to a red display element R via a switching transistor T2. In addition, a green data applied to a green data wiring is applied to a green display element G via a switching transistor T2.

In the (4n−3)-th unit pixel, a red data applied to a red data wiring is applied to a red display element R via a switching transistor T2. In addition, a green data applied to a green data wiring is applied to a green display element G via a switching transistor T2. In addition, a blue data applied to a blue data wiring is applied to a blue display element B via a switching transistor T2.

In this way, even if an arrangement order of sub-pixels in unit pixels adjacent to each other is alternated, a display operation may be normally performed. Moreover, because display elements emitting different color light are located in a column direction, it is possible to reduce or prevent a single color or spot from being visually recognized.

As described above, according to the present disclosure, an arrangement order of sub-pixels in the unit pixels corresponding to the current row and an arrangement order of sub-pixels in the unit pixels corresponding to the previous row or the next row are different from each other, so that it is possible to improve the visibility of spots due to the sub-pixel arrangement near a junction portion to which a plurality of display panels are attached.

Having described embodiments of the present disclosure, it is further noted that it is readily apparent to those of reasonable skill in the art that various modifications may be made without departing from the spirit and scope of the invention which is defined by the metes and bounds of the appended claims, with functional equivalents thereof to be included therein.

What is claimed is:

1. A tiled display device comprising:
   a first sub-display panel on which a plurality of unit pixels is formed; and
   a second sub-display panel on which a plurality of unit pixels is formed, and located adjacent to the first sub-display panel,
   wherein each of the unit pixels comprises a display element for emitting colored light, and a plurality of sub-pixels having a pixel circuit for driving the display element, and
   wherein a first repeating arrangement order of sub-pixels in the unit pixels corresponding to a row of the first sub-display panel is different from a second repeating arrangement order of the sub-pixels in the unit pixels corresponding to a row of the second sub-display panel.

2. The tiled display device of claim 1, wherein adjacent ones of the display elements arranged in a column direction are configured to emit light of different colors.

3. The tiled display device of claim 1, wherein one of the sub-pixels corresponding to an (n)-th row and an (m)-th column, 'n' and 'm' being natural numbers, is configured to emit a first color light, and wherein another one of the sub-pixels corresponding to an (n+1)-th row and the (m)-th column is configured to emit a second color light.

4. The tiled display device of claim 1, wherein an arrangement order of sub-pixels in a unit pixel corresponding to a 2(n)-th row, 'n' being a natural number, is C3-C1-C2, C1 being a first sub-pixel for emitting a first color light, C2 being a second sub-pixel for emitting a second color light, and C3 being a third sub-pixel for emitting a third color light, and
   wherein an arrangement order of sub-pixels in a unit pixel corresponding to a (2n−1)-th row are C1-C2-C3.

5. The tiled display device of claim 4, wherein the first sub-pixel is configured to emit red color light, the second sub-pixel is configured to emit green color light, and the third sub-pixel is configured to emit blue color light.

6. The tiled display device of claim 1, wherein an arrangement order of sub-pixels in a unit pixel corresponding to a 3(n)-th row, 'n' being a natural number, is C2-C3-C1, C1 being a first sub-pixel for emitting a first color light, C2 being a second sub-pixel for emitting a second color light, and C3 being a third sub-pixel for emitting a third color light,
   wherein an arrangement order of sub-pixels in a unit pixel corresponding to a (3n−1)-th row is C3-C1-C2, and
   wherein an arrangement order of sub-pixels in the unit pixel corresponding to a (3n−2)-th row is C1-C2-C3.

7. The tiled display device of claim 6, wherein the first sub-pixel is configured to emit red color light, the second sub-pixel is configured to emit green color light, and the third sub-pixel is configured to emit blue color light.

8. The tiled display device of claim 1, wherein an arrangement order of sub-pixels in a unit pixel corresponding to a 4(n)-th row, 'n' being a natural number, is C3-C1-C2, C1 being a first sub-pixel for emitting a first color light, C2 being a second sub-pixel for emitting a second color light, and C3 being a third sub-pixel for emitting a third color light,
   wherein an arrangement order of sub-pixels in a unit pixel corresponding to a (4n−1)-th row is C2-C3-C1,
   wherein an arrangement order of sub-pixels in a unit pixel corresponding to a (4n−2)-th row is C3-C1-C2, and
   wherein an arrangement order of sub-pixels in a unit pixel corresponding to a (4n−3)-th row is C1-C2-C3.

9. The tiled display device of claim 8, wherein the first sub-pixel is configured to emit red color light, the second sub-pixel is configured to emit green color light, and the third sub-pixel is configured to emit blue color light.

10. The tiled display device of claim 1, wherein each of the unit pixels comprises a first sub-pixel, a second sub-pixel, and a third sub-pixel, and
wherein the first sub-pixel is a red sub-pixel for emitting a red color light, the second sub-pixel is a green sub-pixel for emitting a green color light, and the third sub-pixel is a blue sub-pixel for emitting a blue color light.

11. The tiled display device of claim 1, further comprising a third sub-display panel and a fourth sub-display panel.

12. The tiled display device of claim 1, wherein one of the sub-pixels comprises a current scan wiring, a first data wiring for transmitting a data signal corresponding to a first color light, a second data wiring for transmitting a data signal corresponding to a second color light, and a third data wiring for transmitting a data signal corresponding to a third color light,
wherein the pixel circuit comprises a first transistor connected to the display element, and a second transistor connected to the current scan wiring, and
wherein a source electrode of the second transistor is connected to one of the first data wiring, the second data wiring, and the third data wiring.

13. The tiled display device of claim 1, wherein the display element is an organic light-emitting diode or a nanodiode.

14. A sub-display panel for a tiled display device in which a plurality of sub-display panels is attached to form a tiled display device, the sub-display panel comprising:
a first unit pixel including a plurality of sub-pixels arranged on a plane; and
a second unit pixel located adjacent to the first unit pixel in a column direction, and comprising a plurality of sub-pixels arranged on a plane,
wherein each of the first and second unit pixels comprises a plurality of sub-pixels having a display element for emitting colored light, and a pixel circuit for driving the display element, and
wherein a first repeating arrangement order of sub-pixels in unit pixels corresponding to a row of one of the sub-display panels is different from a second repeating arrangement order of sub-pixels in unit pixels corresponding to a row of another one of the sub-display panels.

15. The sub-display panel for a tiled display device of claim 14, wherein each of the first unit pixel and the second unit pixel comprises a first sub-pixel for emitting a first color light, a second sub-pixel for emitting a second color light, and a third sub-pixel for emitting a third color light, and
wherein an arrangement order of the first to third sub-pixels provided in the first unit pixel and an arrangement order of the first to third sub-pixels provided in the second unit pixel are different from each other.

16. The sub-display panel for a tiled display device of claim 14, wherein an arrangement order of sub-pixels in the first unit pixel is C3-C1-C2, C1 being a first sub-pixel for emitting a first color light, C2 being a second sub-pixel for emitting a second color light, and C3 being a third sub-pixel for emitting a third color light, and
wherein an arrangement order of sub-pixels in the second unit pixel is C1-C2-C3.

17. The sub-display panel for a tiled display device of claim 14, further comprising:
a third unit pixel located adjacent to the second unit pixel in a column direction, and comprising a plurality of sub-pixels arranged in a third order in a row direction on a plane,
wherein an arrangement order of the sub-pixels in the first unit pixel is C2-C3-C1, C1 being a first sub-pixel for emitting a first color light, C2 being a second sub-pixel for emitting a second color light, and C3 being a third sub-pixel for emitting a third color light,
wherein an arrangement order of sub-pixels in the second unit pixel is C3-C1-C2, and
wherein an arrangement order of sub-pixels in the third unit pixel is C1-C2-C3.

18. The sub-display panel for a tiled display device of claim 14, further comprising:
a third unit pixel located adjacent to the second unit pixel in a column direction to comprise a plurality of sub-pixels arranged in a third order in a row direction on a plane; and
a fourth unit pixel located adjacent to the third unit pixel in a column direction to comprise a plurality of sub-pixels arranged in a fourth order in a row direction on a plane,
wherein an arrangement order of the sub-pixels in the first unit pixel is C3-C1-C2, C1 being a first sub-pixel for emitting a first color light, C2 being a second sub-pixel for emitting a second color light, and C3 being a third sub-pixel for emitting a third color light,
wherein an arrangement order of sub-pixels in the second unit pixel is C2-C3-C1,
wherein an arrangement order of sub-pixels in the third unit pixel is C3-C1-C2, and
wherein an arrangement order of sub-pixels in the fourth unit pixel is C1-C2-C3.

* * * * *